(12) United States Patent
Dovids et al.

(10) Patent No.: US 10,504,764 B2
(45) Date of Patent: Dec. 10, 2019

(54) SUBSTRATE STOCKER AND SYSTEMS MANAGEMENT SOFTWARE

(71) Applicant: MURATA MACHINERY, LTD., Kyoto-shi, Kyoto (JP)

(72) Inventors: Gerhard Dovids, Grabs (CH); Yves Fenner, Berg (CH); John Fiddes, Kreuzlingen (CH); Christian Wohanka, Tägerwilen (CH); Bernd Rahrbach, Constance (DE)

(73) Assignee: MURATA MACHINERY, LTD., Kyoto (JP)

( * ) Notice: Subject to any disclaimer, the term of this patent is extended or adjusted under 35 U.S.C. 154(b) by 98 days.

(21) Appl. No.: 15/814,610

(22) Filed: Nov. 16, 2017

(65) Prior Publication Data
US 2018/0134491 A1    May 17, 2018

Related U.S. Application Data

(60) Provisional application No. 62/422,603, filed on Nov. 16, 2016.

(51) Int. Cl.

| | |
|---|---|
| *H01L 21/677* | (2006.01) |
| *H01L 21/673* | (2006.01) |
| *B65G 1/137* | (2006.01) |
| *G05B 19/418* | (2006.01) |
| *G06F 3/048* | (2013.01) |
| *G06Q 10/04* | (2012.01) |

(52) U.S. Cl.
CPC ........ *H01L 21/67763* (2013.01); *B65G 1/137* (2013.01); *G05B 19/41835* (2013.01); *G06F 3/048* (2013.01); *G06Q 10/04* (2013.01); *H01L 21/67346* (2013.01); *H01L 21/67772* (2013.01); *H01L 21/67778* (2013.01)

(58) Field of Classification Search
None
See application file for complete search history.

(56) References Cited

U.S. PATENT DOCUMENTS

| | | | | |
|---|---|---|---|---|
| 5,164,905 | A * | 11/1992 | Iwasaki | G06Q 10/087 414/935 |
| 6,203,617 | B1 * | 3/2001 | Tanoue | H01L 21/67271 118/320 |
| 7,610,111 | B2 * | 10/2009 | Lin | G05B 19/41865 700/101 |

(Continued)

*Primary Examiner* — Thomas Randazzo
(74) *Attorney, Agent, or Firm* — Keating & Bennett, LLP

(57) ABSTRACT

A substrate production, manufacturing, and processing system includes storages with one or more separations that store substrates, loading stations that include robots, opener systems, and a software management system. The storage separations hold first containers that store carriers and the substrates in stacks. Each robot is able to access and move at least one of: the first container, a second container or carrier, and one of the substrates. The opener systems open the first containers such that the carriers and the substrates are able to be accessed by the robots in the loading station, and the software management system assigns at least one category to each stack of carriers and the substrates. The first containers store the substrates with a higher density than the second container or carrier, and the opener systems each include effectors that each hold an individual one of the substrates.

20 Claims, 21 Drawing Sheets

(56) References Cited

U.S. PATENT DOCUMENTS

| | | | |
|---|---|---|---|
| 2003/0063555 A1* | 4/2003 | Yamazaki | H01L 21/67276 370/200 |
| 2003/0130756 A1* | 7/2003 | Baweja | G05B 19/41865 700/100 |
| 2016/0147219 A1* | 5/2016 | Siddiqui | G05B 19/41865 700/101 |

* cited by examiner

Storing substrates in high density stacks in a stocker, wherein the high density stacks comprise a substrate pitch of less than 5 mm
300

FIG. 3A

Transferring individual substrates from a container to an opener station, wherein the substrates in the container comprises a first pitch
320

Collapsing the substrates in the opener station to form a high density stack, wherein the substrates in the high density stack comprise a second pitch smaller than the first pitch
330

Transferring all substrates in the high density stack together to a storage chamber
340

FIG. 3B

Transferring a high density stack from a storage chamber to an opener station, wherein the substrates in the high density stack comprise a first pitch
360

Enlarging the first pitch of the substrates in the opener station to a second pitch
370

Transferring one or more individual substrates with the second pitch from the opener station to a container
380

FIG. 3C

Forming an operation software for a stocker, wherein the operation software minimizes a number of stacks needed to be opened for substrate output requests, wherein the operation software is based on at least one of an input pattern and an output pattern
400

*FIG. 4A*

Selecting stack configurations for a substrate output request that have a minimum number of stacks, wherein the stack configurations meet a substrate requirement of the substrate output request, wherein the selection is based on at least one of an input pattern and an output pattern
420

*FIG. 4B*

Selecting stacks for storing incoming substrates during a substrate input request, wherein the stacks are selected for minimizing a number of stacks needed to be opened during subsequent output requests, wherein the selection is based on at least one of an input pattern and an output pattern
440

*FIG. 4C*

Rearranging substrates in stacks in a storage chamber of a stocker, wherein the stacks are rearranged for minimizing a number of stacks needed to be opened during subsequent output requests, wherein the rearranging is based on at least one of an input pattern and an output pattern
460

*FIG. 4D*

Selecting stacks in a storage chamber of a stocker based on at least one of an input pattern and an output pattern to minimizing a number of needed stacks
900

*FIG. 9A*

Receiving a request for substrates, wherein the request comprises category information of the substrates
920

Obtaining stack configurations, wherein stacks in the stack configurations include substrates meeting the request
930

Obtaining at least one of an input pattern and an output pattern
940

Ranking the stack configurations based on the at least one of the input pattern and the output pattern
950

Selecting stack configuration having highest ranking for obtaining substrates
960

*FIG. 9B*

| Input | Substrates Category | Substrates Category | Substrates Category | Periodicity | Deviation |
|---|---|---|---|---|---|
| #1 | 2 – Cat 1 | 4 – Cat 2 | 3 – Cat 4 | 5 hours | 2 hrs |
| #2 | 5 – Cat 2 | 3 – Cat 4 | 5 – Cat 5 | 5 hours | 4 hrs |
| . . . | | | | | |
| #n | 25 – Cat 7 | | | 100 hours | 50 hrs |

*FIG. 10A*

| Output | Substrates Category | Substrates Category | Substrates Category | Periodicity | Percentage |
|---|---|---|---|---|---|
| #1 | 5 – Cat 3 | 2 – Cat 5 | 5 – Cat 6 | 5 hours | 6 hrs |
| #2 | 5 – Cat 2 | 5 – Cat 4 | | 7 hours | 5 hrs |
| . . . | | | | | |
| #n | 25 – Cat 7 | | | 100 hours | 100 hrs |

*FIG. 10B*

Forming at least one of an input pattern and an output pattern based on information of inputting and outputting substrates to and from a stocker
1100

FIG. 11A

Collecting information related to input configurations and/or output configurations of a stocker
1120

Generating at least one of an input pattern and an output pattern based on the collected information, wherein the at least one of an input pattern and an output pattern is configured to assist in optimizing operations of the stocker
1130

FIG. 11B

Forming an input pattern or an output pattern for a stocker based on an anticipation of substrate input or substrate output to the stocker
1150

FIG. 11C

Predicting at least one of a configuration of substrates inputting to a stocker and a configuration of substrates outputting from a stocker based on at least one of an input pattern and an output pattern
1170

FIG. 11D

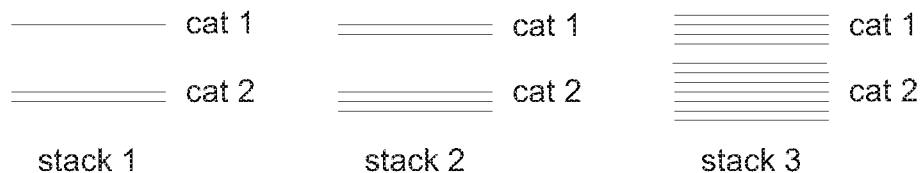
FIG. 12A
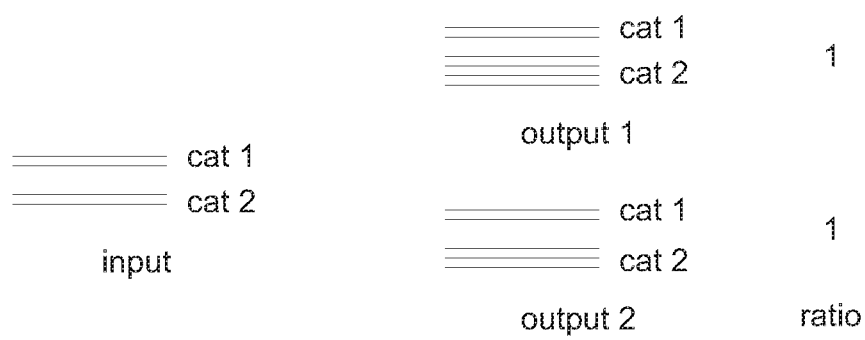
FIG. 12B
FIG. 12C
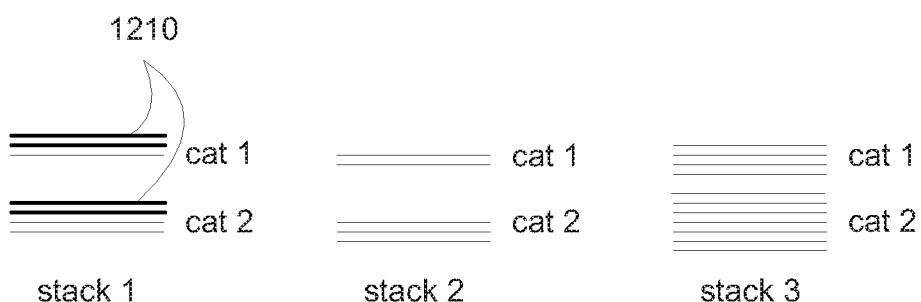
FIG. 12D

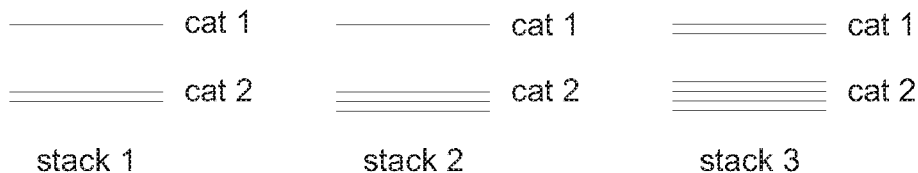
FIG. 13A
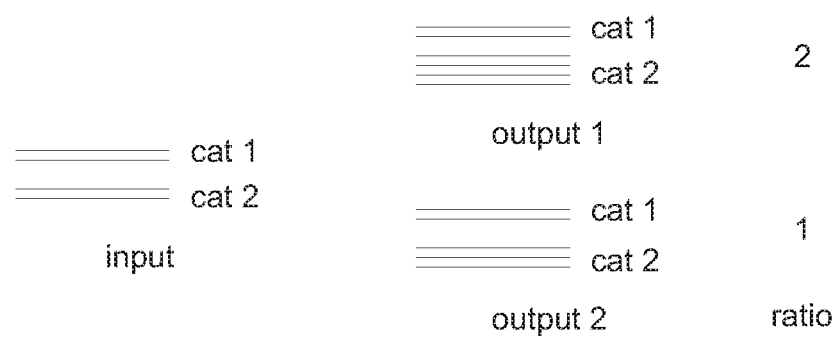
FIG. 13B
FIG. 13C
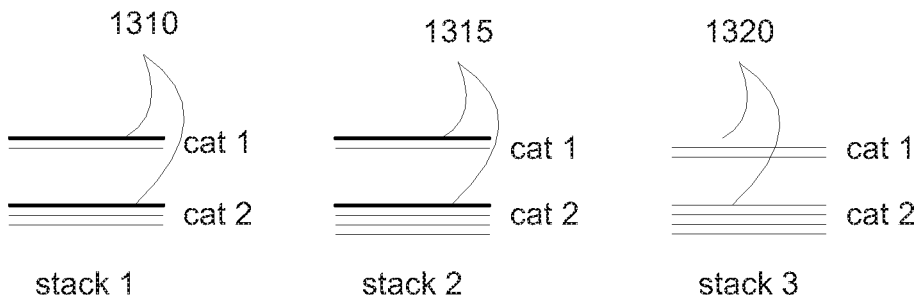
FIG. 13D

Distributing substrates from a substrate input process to stacks in a stocker based on an output pattern
1400

FIG. 14A

Selecting stacks in a stocker to receive substrates from a substrate input to the stocker, wherein the selection is configured to improve a match of individual stacks with an output pattern
1420

FIG. 14B

Identifying substrate information in an input substrates to a stocker
1440

Obtaining an output pattern of the stocker, wherein the output pattern comprises output configurations, wherein the output configurations comprise substrates having characteristics
1450

Determining stack configurations, wherein each stack in each stack configuration is configured to receive one or more of the input substrates, wherein a stack in each stack configuration, after receiving one or more of the input substrates, has a better match with an output configuration in an output pattern
1460

Selecting a stack configuration having a best match of a ratio of the output configurations in the output pattern
1470

FIG. 14C

Distributing substrates from a substrate input process to stacks in a stocker based on an output pattern and an input pattern
1700

*FIG. 17A*

Selecting stacks in a stocker to receive substrates from a substrate input to the stocker, wherein the selection is configured to improve a match of individual stacks with an output pattern, taken into account an input pattern
1720

*FIG. 17B*

Identifying substrate information in an input substrates to a stocker
1740

Obtaining an output pattern and an input pattern of the stocker
1750

Determining stack configurations, wherein the stack configurations improve a match of the stacks in the stocker with an output configuration in an output pattern, taken into account the input pattern
1760

Selecting a stack configuration having a best match
1770

*FIG. 17C*

Rearranging substrates in a stocker based on an output pattern
1900

FIG. 19A

Selecting stacks in a stocker to receive substrates from other stacks or to move substrates to other stacks, wherein the selection is configured to improve a match of individual stacks with an output pattern
1920

FIG. 19B

Obtaining an output pattern and an input pattern of the stocker
1940

Determining stack pairs, wherein a stack pair comprises an input stack and an output stack, wherein substrates are configured to move from the output stack to the input stack, wherein the stack pairs are configured to improve a match of the stacks in the stocker with an output pattern
1950

Moving substrates in the stack pairs
1960

FIG. 19C

Rearranging substrates in a stocker based on an output pattern and an input pattern
2100

*FIG. 21A*

Selecting stacks in a stocker to receive substrates from other stacks or to move substrates to other stacks, wherein the selection is configured to improve a match of individual stacks with an output pattern, taken into account an input pattern
2120

*FIG. 21B*

Obtaining an output pattern and an input pattern of the stocker
2140

Determining stack pairs, wherein a stack pair comprises an input stack and an output stack, wherein substrates are configured to move from the output stack to the input stack, wherein the stack pairs are configured to improve a match of the stacks in the stocker with an output pattern, taken into account the input pattern
2150

Moving substrates in the stack pairs
2160

*FIG. 21C*

SUBSTRATE STOCKER AND SYSTEMS MANAGEMENT SOFTWARE

CROSS REFERENCE TO RELATED APPLICATIONS

This application claims priority from at least U.S. Provisional Patent Application 62/422,603 filed on Nov. 16, 2016 entitled "Substrate Stocker and Systems Management Software" and U.S. Provisional Patent Application 62/355,856, filed on Jun. 28, 2016 entitled "Substrate Storage and Processing" which applications may be incorporated herein by reference in their entirety for all purposes.

FIELD OF TECHNOLOGY

This disclosure relates generally to manufacturing management software and more specifically to substrate manufacturing management software. Example embodiments to methods, apparatuses, and systems provide software or management of substrates, substrate carriers, stockers, and associated and other related devices, systems, and methods that improve efficiency in production, manufacturing, and processing of substrates.

BACKGROUND

Within many fields, substrates, wafers, etc. must be processed, stored and otherwise moved within a factory, assembly line, or system. Since the introduction of the 300-mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they are clamped in place by fins and held for later use. Yet FOUPs today are hampered by methods and system designs which may contaminate their contents, chafe wafers, and delay loading and unloading of substrate wafer contents as a result of multifarious construction. Thus, there may be a need for an invention that more efficiently and accurately accomplishes the desired tasks of FOUPs.

The improved Tec-Cell provides this improvement, and as such may be to become the new standard in substrate manufacturing. With many advantages over the prior arts and FOUPS, Tec-Cells provide for high density, efficient, clean and resilient processing and capabilities over prior art. However, Tec-Cell systems must work within larger systems and existing infrastructure and as such the new components, systems, buffers, stations, etc. must be made to be able to either through adapters, or otherwise be able to interface with existing systems, carriers etc., of which are mostly FOUPs but may be other designs and standards. Specifically, to this application, FOUP and other Prior Art substrate systems have subpar management software and systems that are not able to handle the increased capacity and design complexity and abilities of future substrate manufacturing needs, especially those using Tec-Cells.

Therefore, software and system management that may be improved and provides for more robust abilities may be necessary wherein the software can control Tec-Cells, FOUPs, and the associated movement systems and structures, such as stockers, transfer mechanism, openers etc., in an efficient manner. However, prior systems have not been able to provide this ability or capability, and may be missing the complexity of providing for controlling the systems. In addition, prior systems may not be able to move substrates between stacks based on both input and output characteristics, and may have limitations for providing an efficient service of substrates.

It may be clear then these may be a need for software and management system, apparatuses and devices which provide for efficient and seamless management of substrate processing steps, including intermediary storage, transferring and system integration of Tec-Cell substrates among other types such as FOUPs. This improved software and management system then can be used to provide substrates efficiently and quickly, including improvements such as tracking, identification, sorting, and transferring etc. as well as provide efficient high-density storage, which may be able to move and transfer substrate between each other based on categories, and other characteristics, as well as being able to be implemented in existing FOUP systems and other systems, of which may be needed within the field.

SUMMARY

Preferred embodiments of the present invention provide a software or management of substrates, substrate carriers, stockers, and associated and other relates devices systems and methods that improve efficiency during production, manufacturing, and processing of substrates.

A preferred embodiment of the present invention provides a system, apparatus or method, where a substrate storage, buffer, system, and other related devices may be controlled by a management system, of which may include devices and software and processing apparatuses. The management system may provide then increase efficiencies and abilities to the system. And of which may be provided to be a primary portion of the present invention. The software and system may provide increase efficiency and abilities of substrate manufacturing and processing systems among other applications and improvements. The software and system may provide an ability to differentiate storages, containers, compartment, substrates, areas and other aspects of the system by categories, groups and separations wherein each separation, category or group may have at least one criteria, and wherein based on the criteria actions may be provided. In an embodiment, which may be combined with any other embodiment, the management system may provide an ability to provide for a stocker to interact with an outside system. For instance, wherein substrates may such as Tec-Cells may be opened or closed states prior to being introduced, and wherein an opener station may open or close the substrates, such that in the storage area, they may be high density, but wherein when removed that may be accessed, wherein the software management provides an efficient process steps.

According to a preferred embodiment of the present invention, the management system may provide a software which may optimize or minimize routes, accesses, number of stacks, storage operations, and any other operations based on an input request and input pattern and an output pattern, request, limitation, and wherein as described operations may take place wherein the software optimizes of efficiently provides. This may be among many other features. Such as wherein specific limitations or inputs are provided and these are broken into numerous categories of any plurality or type, and wherein the software with the system may provide an optimized route, transfer or organization wherein a desired output may be achieved. This may be provided to combines stacks, categories or other outputs including based on a ranking system among others.

Preferred embodiments of the present invention provide a management system which provides for improved efficiency in substrate manufacturing and systems, especially stocker storage and buffering, wherein the management system may be then able to provide efficient storage of different types, categories and states of substrates in a highly efficient and procure substrates in a timely manner, while being able to interact with exterior systems, devices and apparatuses.

The methods and systems disclosed herein include various implementations to provide the described features and advantages. Other features will be apparent from the accompanying drawings and from the detailed description that follows.

BRIEF DESCRIPTION OF THE DRAWINGS

Example embodiments are illustrated by way of example and are not limited to the figures of the accompanying drawings, in which, like references indicate similar elements.

FIGS. 3A, 3B and 3C are process diagrams of an embodiment of the present invention substrate stocker, substrate carriers, or substrates with substrate stocker management software (SSCMS).

FIGS. 4A, 4B, 4C and 4D are process diagrams of an embodiment of the present invention substrate stocker, substrate carriers, or substrates with substrate stocker management software (SSCMS).

FIGS. 9A and 9B are process view of an embodiment of the present invention substrate stocker, substrate carriers, or substrates with substrate stocker management software (SSCMS).

FIGS. 10A and 10B are process diagrams of an embodiment of the present invention substrate stocker, substrate carriers, or substrates with substrate stocker management software (SSCMS).

FIGS. 11A, 11B, 11C and 11D are process diagrams of an embodiment of the present invention substrate stocker, substrate carriers, or substrates with substrate stocker management software (SSCMS).

FIGS. 12A, 12B, 12C and 12D are process views of an embodiment of the present invention substrate stocker, substrate carriers, or substrates with substrate stocker management software (SSCMS).

FIGS. 13A, 13B, 13C and 13D are process views of an embodiment of the present invention substrate stocker, substrate carriers, or substrates with substrate stocker management software (SSCMS).

FIGS. 14A, 14B and 14C are process diagrams of an embodiment of the present invention substrate stocker, substrate carriers, or substrates with substrate stocker management software (SSCMS).

FIGS. 17A, 17B and 17C are process diagrams of an embodiment of the present invention substrate stocker, substrate carriers, or substrates with substrate stocker management software (SSCMS).

FIGS. 19A, 19B and 19C are process diagrams of an embodiment of the present invention substrate stocker, substrate carriers, or substrates with substrate stocker management software (SSCMS).

FIGS. 21A, 21B and 21C are process diagrams of an embodiment of the present invention substrate stocker, substrate carriers, or substrates with substrate stocker management software (SSCMS).

Figure 1A:
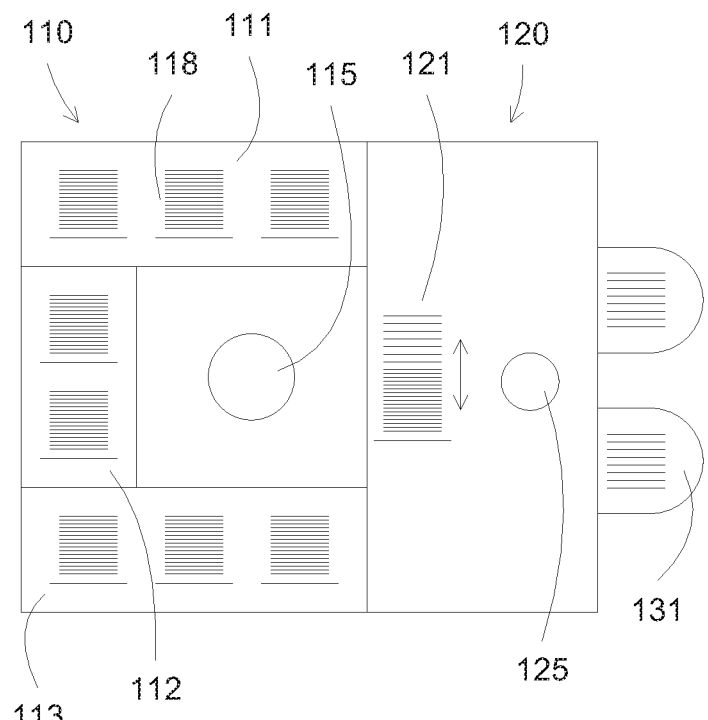
FIG. 1A and FIG. 1B are top down component views of an embodiment of the present invention substrate stocker, substrate carriers, or substrates with substrate stocker management software (SSCMS).

Other features of the present embodiments will be apparent from the accompanying drawings and from the detailed description that follows.

DETAILED DESCRIPTION

Disclosed are methods, apparatus, and systems that may in one example embodiment, to methods, apparatus, and systems which provides for a software or management of substrates, substrate carriers, stockers and associated and other relates devices systems and methods such that improved efficiency are able to be realized in production, manufacturing, and processing of substrates.

The present invention may provide in one embodiment, which may be combined with any other embodiment, a system, apparatus or method, where a substrate storage, buffer, system, and other related devices may be controlled by a management system, of which may include devices and software and processing apparatuses. The management system may provide then increased efficiencies and abilities to the system.

In an embodiment, which may be combined with any other embodiment, the management system may provide an ability to differentiate storages, containers, compartment, substrates, areas and other aspects of the system by categories, groups and separations wherein each separation, category or group may have at least one criterion.

In an embodiment, which may be combined with any other embodiment, the management system may provide control and ability to affect the system such that operations are tasked or one a specific time intervals, immediately or via time delay. This may include any operation available to the system, such as openers, robots etc.

In an embodiment, which may be combined with any other embodiment, the management system may provide an ability to provide for a stocker, wherein substrates such as Tec-Cells, high density or low density containers or any other substrates or carrier system may be held, wherein the containers may be opened or closed states prior to being introduced, and wherein an opener station may open or close the substrates, such that in the storage area, they may be high density, but wherein when removed that may be accessed. The present invention may be software which controls these operations.

In an embodiment, which may be combined with any other embodiment, the management system may provide a software which may provide for optimizes or minimizing routes, accesses, number of stacks, storage operations and any operations be based on an input request and input pattern and an output pattern, request limitation, and wherein as described operations may take place wherein the software optimizes of efficiently provides.

In an embodiment, which may be combined with any other embodiment, the management system may provide wherein specific limitations or inputs are provided and these are broken into numerous categories of any plurality or type, and wherein the software with the system may provide an optimized route, transfer or organization wherein a desired output may be achieved. This may be provided to combines stacks, categories or other outputs including based on a ranking system among others.

Wherein the stacker management system may be able to rearrange or minimize stacks, storages or uses automatically, manually, or through any the process and wherein the software may be directly or indirectly integrated with the hardware system, as well as provided to be able to be controlled remotely, autonomously or by any other process. It may be noted the software may be locally run, or may be remotely run such as in the cloud or server, or may be run on local machines such as controllers etc.

In an embodiment, which may be combined with any other embodiment, the management system may provide data and tracking to a user, or other system, wherein any data may be tracked, recorded in any fashion, and may be presented in user interfaces in any device or monitor, as well as networked.

In an embodiment, which may be combined with any other embodiment, the management system may provide the stocker management system and software works with MES manufacturing execution) and Material Tracking system and may interface with any existing systems, as well as Tec-Cells FOUPs, among others.

In an embodiment, which may be combined with any other embodiment, it may be noted that the present invention may track substrates, groups of substrates and categories of substrates by any method, of which may include wherein the substrates or holder itself has a RFID or other identification, larger compartments, storages or containers, may have RFID or other abilities, or the system may be able to send condition or characteristics (such as seeing contamination or substrate shape, etc. to categorized or provide for certain substrates, as well as other actions such as organization etc.

In an embodiment, the stocker and substrate system for which the management system and software system may manage may include at least a Physical storage wherein a single wafer may be stored in a Tec-Cell, wherein any plurality such as 100 Tec-Cells are bundled in a Tec-Cell module, wherein up to or at least 4 Tec-Cell modules are bundled in a Tec-Cell tower and wherein up to or at least 6 Tec-Cell towers are bundled in a wafer stocker. In some embodiments, the Tec-Cells/modules/towers are mounted in fixed positions. The system may also include wherein each wafer may be directly accessible by EFEM robot.

The stocker and substrate system for which the management system and software system may manage may include at least wafer categories wherein the wafer categories may be of any type and designation and be differentiated by the system in any manner. These categories may be wherein a category may be a name for a group of wafers in a certain condition. Additionally, a category may have the auto-remove feature enabled which determines if wafers are still to be remembered or not after leaving the stocker. Also in some embodiments, a category may have other categories, so called "next categories", assigned to it. However, only one of the assigned "next categories" is able to be the active "next category" at a specific point in time. In some embodiments, a category has a downgrade limit which may be activated if a category has an active next category. When the downgrade limit for a wafer may be reached (x times in/out stocker), the wafer will be assigned to the next category.

It may be noted that any change in category may facilitate an action by the system.

Categories may be bundled in category groups, wherein a category group assigns bundled categories to at least one Tec-Cell module. A category group may also either of type "mixed" or "isolated" or "fixed slots". Mixed may allow the usage of assigned Tec-Cell modules also for other category groups as well as other substrate carries including FOUPs etc. Isolated reserves assigned Tec-Cell modules for the category group exclusively may exist. In other embodiments, there may be fixed slots reserves a user defined number of slots from assigned Tec-Cell modules for the category group exclusively. Categories and category groups may also be created/modified and assigned to physical storage by users according to their needs.

The stocker and substrate system for which the management system and software system may manage may include ability for assigning and carrying out Wafer jobs wherein the Input by category. In some embodiment, his may include wherein the storage Tec-Cell for each wafer may be always selected by the equipment software, based on the wafer category setup and physical storage assignment, the wafer stocker may setup/used to automatically handle wafer category downgrading (by next categories), this job must be used to bring in wafers for the first time. In this case it specifies to which category a wafer initially belongs. In other embodiments, the input may be known wafers wherein these jobs must only be used if the wafer stocker may be configured to remember wafers or otherwise through sensors, memory, data or any other method assign wafers data. Otherwise, the storage Tec-Cell for each wafer may be selected by the equipment software, based on the category the wafer was assigned last time it was in the stocker, combined with the downgrade limit and active next categories.

The stocker and substrate system for which the management system and software system may manage may include wherein Output may be by category wherein wafers may be just pulled from a category. Which individual wafers are pulled may be always decided by the equipment software. Other embodiment may include wherein output by wafer id wherein wafers are pulled by their id and wherein which may include which individual wafers are pulled may be always decided by the user.

In some embodiments the wafer stocker, the user/customer directly assigns storage slots to category groups. The user configures the storage layout and the separation of wafers by assigning physical storage to category groups. Overcommitting physical storage by assigning the same Tec-Cell modules multiple times to category groups of type mixed may be possible. The software may be just executing jobs according to the configured storage assignment because every wafer may be directly accessible.

In an embodiment, it may be described where the category as a single chain link in a category chain. Next categories purpose may be to automatically change substrate category assignment, dependent on the substrates usage over time such as changes in manufacturing, product characteristics or other data. As category setup also affects physical locations, the substrates physical storage location may be also influenced using next categories. Thus, it may be necessary that a software or management provides the ability to actively change attributes, including physical location of the substrates, etc., based on the data or factors.

An example embodiment may be that a substrate (wafer) may starts lifecycle in the first category of such a category chain. As the substrate may be leaving/re-entering the stocker, as downgrade value increases. As soon, as the substrates downgrade value hits the downgrade value of the category, the substrate will be automatically downgraded to the next category in the category chain. For example, a CAT1 with downgrade limit 2 and next category defined as CAT2 wherein then CAT2 with downgrade limit 3 and next category defined as CAT3 wherein then CAT33 without downgrade limit and no next category. From these definitions, a WFR enters stocker first time and may be initially assigned to CAT1. The WFR may be remembered to belong to CAT 1 and count may be set to initial value of 1. The WFR leaves stocker and re-enters it. The WFR may be automatically reassigned to CAT1 and count. Then the WFR leaves stocker and re-enters it→WFR may be automatically downgraded to CAT2 and count may be reset to 1. Then the WFR leaves stocker and re-enters it wherein then WFR may be automatically reassigned to CAT2 and count ++. From there, WFR leaves stocker and re-enters it wherein the WFR may be automatically reassigned to CAT2 and count ++. The WFR leaves stocker and re-enters it wherein WFR may be automatically downgraded to CAT3 and count may be reset to 1. From now on, WFR remains in CAT3 as no next categories are present anymore, however this process is able to be continued or edited on the fly to alter have more actions. As well as this, this simplified example is able to be made more complex within the present invention.

Pseudocode:
IF WFR may be not known
set wfrcategory to user defined category
set wfrusagecount=1
ELSE
  IF wfrcategory HAS nextcategory && wfrusagecount MAY BE wfrcategory. downgradelimit
    Set wfrcategory to wfrcategory.nextcategory
    Set wfrusagecount=1
  ELSE
    Wfrusagecount++
  END IF
END IF
Store WFR to wfrcategory
End pseudocode.

In some embodiments, remembering substrates allows the FAB automation to actually outsource the substrate usage tracking and, along with the next categories function, the substrate management to the stocker. The FAB automation may be not required to implement such logic.

The downgrade limit may provide a defined value of use cycles after which a substrate may be downgraded to the next category if assigned. Without it, the system would not have an indication when to downgrade a substrate. This may be wherein the single substrate use cycle count may be increased by one each time a wafer re-enters or enters the stocker.

It may be seen that categories are just an artificial object to create a virtual/artificial structure over a set of substrates. It may be similar to folders in a file system. Substrates go into those categories as files go into folders. The advantage of categories may be basically to have an ability to create and represent a user (FAB) defined substrate structure.

Because category groups are virtual/artificial structures over a set of categories. It may be similar to folders on a drive. Categories go into category groups as folders reside on drives. In addition, category groups contain an additional indicator that allows strict storage isolation. This may be represented by the dedicated flag/attribute.

The advantage of category groups may be to have the ability of creating and representing a user (FAB) defined storage isolation level by utilizing the (already) user defined substrate structure (categories) in combination with the ability to allow introduce additional flags/attributes (e.g., dedicated flags) that allow for individual behavior, for example, totally isolated storage assignment in case of dedicated flag/attribute.

An embodiment of a user assigns a category and a category group may be that it may be similar to like folder (category group) and subfolder (category), with the wafers being the individual files in the subfolder wherein a two-step process. The first step may be the setup work performed by, for example, the a tool/process engineer, including creating categories such as empty files have a unique name and creating category groups such as creating folders with unique names. Assigning categories to category groups may be the process of creating a link inside a category group to the category that shall be included. A category may only be included if certain conditions match (e.g. it may be only linked to a single category group if the dedicated flag may be true). A category may also be linked to many groups—so it may be more than a link than a copy, in terms of file systems). The second step may be substrate recognition wherein this happens when the substrate initially enters the stocker for the first time. In other words, the substrate may be unknown to the stocker. This may be done by just selecting the target category on the user interface in LOCAL control state, or passing the target category in a SECS message in REMOTE control state. The substrate may be then (if auto-remove may be false) remembered in that category. In terms of files, an entry to the category file may be made for that substrate.

In an embodiment, which may be combined with any other embodiment the storage Tec-cell may be selected based on output pattern analysis. This may be wherein there are a lot of scenarios and all use different aspects of pattern analysis in combination with storage layout analysis to figure out what to do. They may be even combined. An example embodiment may be wherein Substrates are organized according to the following category/group setup. No dedication may be set.

CAT1+CAT2+CAT4 assigned to CATGR124
CAT3+CAT4 assigned to CATGR34
CAT3+CAT4+CAT5 assigned to CATGR345

Stocker has 5 Tec-Cell Stacks (TCS) that are filled as follows:

WFR of CAT1 stored in TCS1
10 WFR of CAT2 stored in TCS1
10 WFR of CAT3 stored in TCS2
10 WFR of CAT4 stored in TCS2
10 WFR of CAT5 stored in TCS3
10 WFR of CAT6 stored in TCS3
0 WFR stored in TCS4
0 WFR stored in TCS5

Stocker does not have any output patterns learned or predefined.

Fab requests 5 substrates by category
SLOT1→CAT2
SLOT3→CAT1
SLOT5→CAT4
SLOT7→CAT2
SLOT9→CAT1
SLOT11→CAT4
SLOT13→CAT2
SLOT15→CAT1
SLOT17→CAT4

Based on the request, the software may detect and record or memorizes patterns, in one/many ways, for example:

Category base mix: CAT1, CAT2, CAT4
Category base mix usage count: (CAT1, CAT2, CAT4) usage++
Carrier category slot map pattern (25 slot FOUP): CAT2, NONE, CAT1, NONE, CAT4, NONE, CAT2, NONE, CAT1, NONE, CAT4, NONE, CAT2, NONE, CAT1, NONE, CAT4, NONE, NONE, NONE, NONE, NONE, NONE, NONE, NONE
Wafer count per category: CAT1→3, CAT2→3, CAT4→3

To provide this job, the equipment may pull substrates from TCS1 and TCS2. The stocker ends up with:

7 WFR of CAT1 stored in TCS1
7 WFR of CAT2 stored in TCS1
10 WFR of CAT3 stored in TCS2
7 WFR of CAT4 stored in TCS2
10 WFR of CAT5 stored in TCS3
10 WFR of CAT6 stored in TCS3
0 WFR stored in TCS4
0 WFR stored in TCS5

Now the 9 wafers are coming back into the stocker.

Stocker reads the substrates and utilizes open buffer when required to determine the number of wafers per category of the returning wafers. Those are 3 of CAT1, 3 of CAT2, 3 of CAT4

Stocker software looks at the saved output patterns to determine all matching patterns, which may be a previously saved pattern. However, there may be more than one matching pattern.

CAT1, CAT2, CAT4

For each of those patterns (starting with the most used ones), the stocker looks for possible category groups to store those substrates together. It may be weighted by the number of wafers that may be stored together. This case leads to:

CATGR124→allows storing CAT1, CAT2, CAT4→so has a weight of 3
CATGR34→allows storing CAT4→so has a weight of 1

Software checks the storage utilization of the selected groups by weight, so starting with CATGR124, it determines that TCS1 may be currently used and contains 7 WFR of CAT1 stored in TCS1
7 WFR of CAT2 stored in TCS1
11 slots free in TCS1

According to the number of free slots in the modules, the software decides, if all substrates may enter a single TCS or not. In case the substrates do not fit into one TCS or there are more than one TCS where all substrates may fit, software determines the suitable TCS or the sequence of TCS by shared wafer count per category, whereby it aims at an equal distribution.

All substrates now enter TCS1. The storage layout of the stocker looks like this:

10 WFR of CAT1 stored in TCS1
10 WFR of CAT2 stored in TCS1
3 WFR of CAT4 stored in TCS1
10 WFR of CAT3 stored in TCS2
7 WFR of CAT4 stored in TCS2
10 WFR of CAT5 stored in TCS3
10 WFR of CAT6 stored in TCS3
0 WFR stored in TCS4
0 WFR stored in TCS5

The storage layout may be already optimized for the output pattern. If the FAB requests the same pattern again, the equipment pulls substrates just from TCS1. The layout of the storage is adjusted to the FAB demand, as far as the user defined rules allowed it.

In another embodiment which may be combined with any other embodiment. Substrates are organized according to the following category/group setup. No dedication may be set.

CAT1+CAT2 assigned to CATGR12
CAT3+CAT4 assigned to CATGR34

Stocker has 5 Tec-Cell Stacks (TCS) that are filled as follows:

25 WFR of CAT1 stored in TCS1
25 WFR of CAT2 stored in TCS2
25 WFR of CAT3 stored in TCS3
25 WFR of CAT4 stored in TCS4
0 WFR stored in TCS5

Stocker does not have any output patterns learned or predefined.

Fab requests 5 substrates by category
SLOT1→CAT2
SLOT3→CAT1
SLOT5→CAT2
SLOT7→CAT1
SLOT9→CAT2
SLOT11→CAT1
SLOT13→CAT2
SLOT15→CAT1
SLOT17→CAT2
SLOT19→CAT1

Based on the request, the software detects and memorizes patterns, in one/many ways, for example:

Category base mix: CAT1, CAT2
Category base mix usage count: (CAT1, CAT2) usage++
Carrier category slot map pattern (25 slot FOUP): CAT2, NONE, CAT1, NONE, CAT2, NONE, CAT1, NONE, CAT2, NONE, CAT1, NONE, CAT2, NONE, CAT1, NONE, CAT2, NONE, CAT1, NONE, NONE, NONE, NONE, NONE, NONE Wafer count per category: CAT1→5, CAT2→5

To provide this job, the equipment has to pull substrates from TCS1 and TCS2. The stocker ends up with 20 WFR of CAT1 stored in TCS1
20 WFR of CAT2 stored in TCS1
25 WFR of CAT3 stored in TCS3
25 WFR of CAT4 stored in TCS4
0 WFR stored in TCS5

Now the 10 wafers are coming back into the stocker.

Stocker reads the substrates and utilizes open buffer when required to determine the number of wafers per category of the returning wafers. Those are 5 of CAT1, 5 of CAT2

Stocker software looks at the saved output patterns to determine all matching patterns, which may be a previously saved pattern. However, there may be more than one matching pattern.

CAT1, CAT2

For each of those patterns (starting with the most used ones), the stocker looks for possible category groups to store those substrates together. It may be weighted by the number of wafers that may be stored together, which leads to:

CATGR12→allows storing CAT1, CAT2→so has a weight of 2

Software checks the storage utilization of the selected groups by weight, so starting with CATGR12, it determines that TCS1 & TCS2 may be currently used and contains 20 WFR of CAT1 stored in TCS1
20 WFR of CAT2 stored in TCS1
5 slots free in TCS1
5 slots free in TCS2

According to the number of free slots in the modules, the software decides, if all substrates may enter a single TCS or not. In case the substrates do not fit into one TCS or there are more than one TCS where all substrates may fit, software determines the suitable TCS or the sequence of TCS by shared wafer count per category, whereby it aims at an equal distribution.

Aiming at a distribution of substrates, the CAT1 substrates now enter TCS2 and CAT2 substrates now enter TCS1. The storage layout of the stocker looks like this:

20 WFR of CAT1 stored in TCS1
5 WFR of CAT2 stored in TCS1
20 WFR of CAT2 stored in TCS2
5 WFR of CAT1 stored in TCS2
25 WFR of CAT3 stored in TCS3
25 WFR of CAT4 stored in TCS4
0 WFR stored in TCS5

The storage layout may be already optimized for the output pattern. If the FAB requests the same pattern again, the equipment pulls substrates just from TCS1 or TCS2, but not both anymore. The layout of the storage is adjusted to the FAB demand, as far as the user defined rules allowed it.

In some embodiments, the stock and system may apply defragmentation or other applicable system abilities to apply the patterns to the whole storage and reorganize the stocker or any other system for maximum efficiency or upkeep, such as to update if rules or criteria are met since last check.

In a preferred embodiment, which may be combined with any other embodiment, the present invention may provide a software management system which may manage a substrate processing, manufacturing or storage system. This system may include one or more storage stations made of one or more compartments for storing a plurality of substrates, wherein the storage compartment holds high density containers wherein the containers store carriers and substrates in stacks in a high density configuration; one or more transport stations wherein the transport station are made of one or more robots, wherein each robot is able to access and move at least one of: the high-density container, low density container or carrier and substrate; one or more opener systems for opening the high density containers such that the carriers and substrates may be accessed by the one or more robots in the transport station. It is noted then that the software management system assigns at least one category to each stack of carriers and substrates and that each stack as a whole has a single category or each stack may have different categories assigned for different carriers and substrates within the stack.

In some embodiments, which may be combined with any other embodiments, the categories aforementioned may be based on pre-defined physical characteristic of the carrier and substrate or stack or for instance condition sensor data. In other embodiments, the categories may be dependent on a time characteristic of the stack or carrier and substrate, wherein the category is changed on a time dependent basis.

In some embodiments, which may be combined with any other embodiments, the software system may control at least one station such that the software controls actions including at least one of: combining stacks, rearranging stacks, combining categories or other outputs based on the categories assigned and where the system then optimizes or minimizes a route, accesses, number of stacks, storage operations and any operations. It is noted that the optimization or minimization is based on an input request and pattern or an output pattern or limitation and that each category may include a ranking system based on defined categories.

It is noted that the software management system may be provided with a user interface and is able to be network controlled or local controlled and by any user or also may be predominantly automated.

In some embodiments, which may be combined with any other embodiments, the present invention may provide a software management method to manage a substrate storage wherein the method may include at least providing a stack of carriers and substrates in a high density container, storing the stack of carriers and substrates in a high density container in a storage compartment, wherein storage compartment is inventoried by at least quantity and category and assigning at least one category to each stack of carriers and substrates. The method then is able to provide a desired stack configuration output for at least one stack and associated container for output, wherein: the stack configuration includes criteria for quantity and category for the output stack, checking the inventory of the storage compartment for the requested output and calculating the required input from the storage compartment to match the requested output, wherein the input at least satisfied the desired stack configuration output. The method may then further provide moving at least the containers from the required input and requested output by a transport station to an opener station, opening the high-density containers such that the carriers and substrates are accessible, accessing the carriers and substrates and moving them to a destination container such that the destination container contents matches the requested output and finally transporting the destination container to a destination location.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods are industry terms and may refer to similar alternatives. In addition, the components shown in the figures, their connections, couples, and relationships, and their functions, are meant to be exemplary only, and are not meant to limit the embodiments described herein.

Figure 1B:
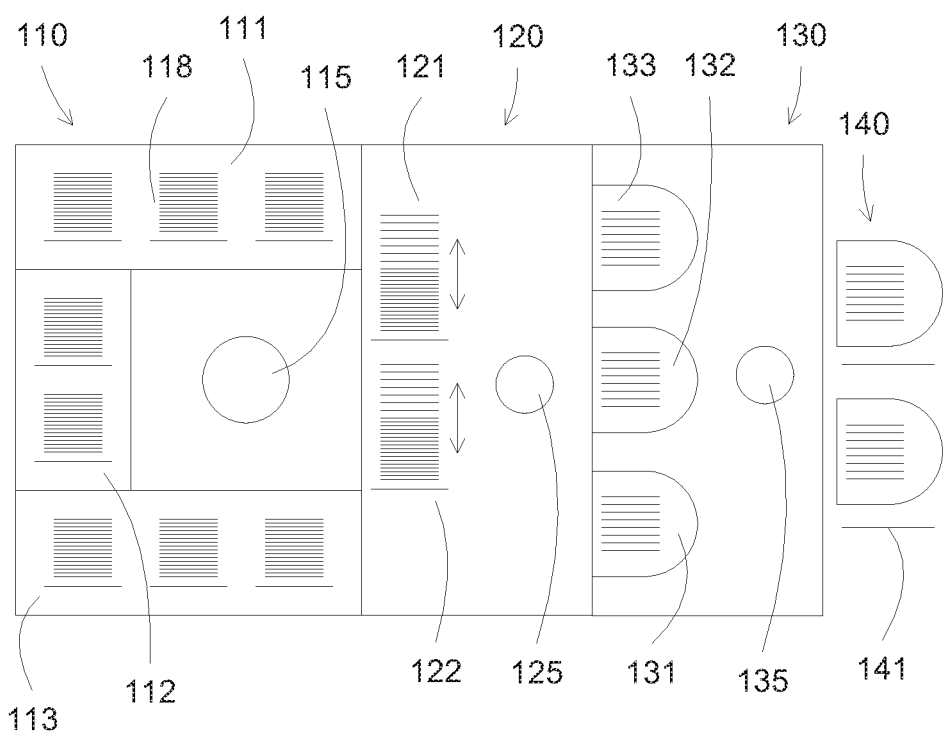

FIG. 1A and FIG. 1B are top down component views of an embodiment of the present invention substrate stocker, substrate carriers, or substrates with substrate stocker management software (SSCMS).

FIG. 1A shows at least a Stocker including at least one Storage 110 (shown as bare wafer storage for Tec-cell stacks 118, but may be others). Each storage 110 may have different separations 111, 112, 113. Each storage 110 may have certain characteristics, such as different levels of cleanliness or types of product stored, etc. Additionally, each separation is able to be used to store each or different category group. A category group may be a class of wafers, consisting of different categories (for example, category group 1 is able to be cleanliness class 1, stored in separation 111). A category may be a collection of wafers, such as a lot of wafers (for example, category 1 is able to be 13 wafers put together to be run as a job). Category 1, category 2 and category 3 are able to belong to category group 1. Additionally, a robot 115 using any method, such as an arm and effector, is able to move whole Tec-cell stacks 118 (e.g., collapse Tec-cell stack) from storage 110 to opener chamber 120. The opener station 121 can enlarge and collapse Tec-cell stacks 118. An additional Robot 125 is able to move individual wafers from enlarged or opened Tec-cell stacks 118 on the opener station 121 to FOUP 131.

FIG. 1B shows an additional embodiment of a stocker that is able to include multiple opener stations 121 and 122. The multiple opener stations 121 and 122 are able to allow wafers to be picked from multiple Tec-cell stacks 118 to provide a mixed lot. Multiple transfer FOUPs 131, 132, and 133 are able to be provided in transfer chamber 130. Robot 135 is able to transfer whole FOUPs (wafers and container) from FOUP station 141 to transfer FOUPs 131, 132, 133, among other. The multiple transfer FOUPs are able to reduce congestion, e.g., quickly move FOUPs from loading stations 141 to transfer stations 131, 132, 133, so additional FOUPs are able to be placed on loading stations. Other configurations are able to be used, such as EFEM and OHT methods, systems and apparatus.

FIGS. 2A, 2B, 2C and 2D are side component views of an embodiment of the present invention substrate stocker, substrate carriers, or substrates with substrate stocker management software (SSCMS).

Figure 2A:
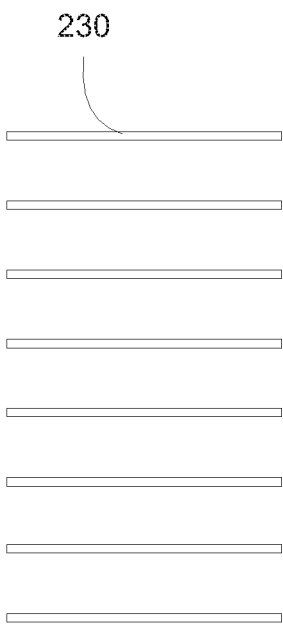
FIGS. 2A, 2B, 2C and 2D are side component views of an embodiment of the present invention substrate stocker, substrate carriers, or substrates with substrate stocker management software (SSCMS).

FIG. 2A shows substrates 230 in a container, wherein the container may be a high density container or low density container.

Figure 2B:
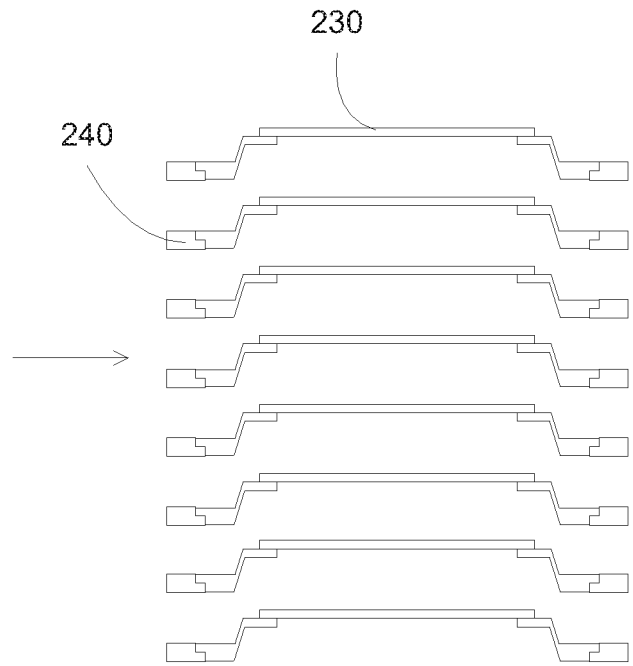

FIG. 2B shows the substrates 230 in an opener station wherein holders, effectors 240 are able to hold the substrates 230, wherein the substrates are shown in an enlarged pitch state with a distance between each substrate.

Figure 2D:
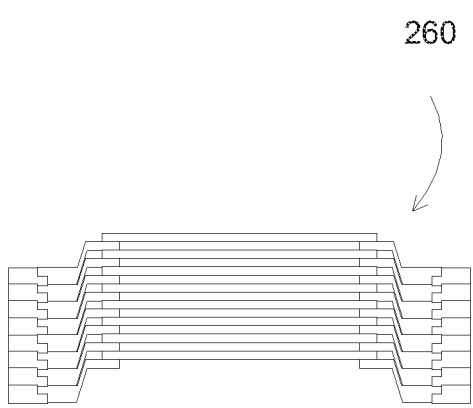
Figure 2C:
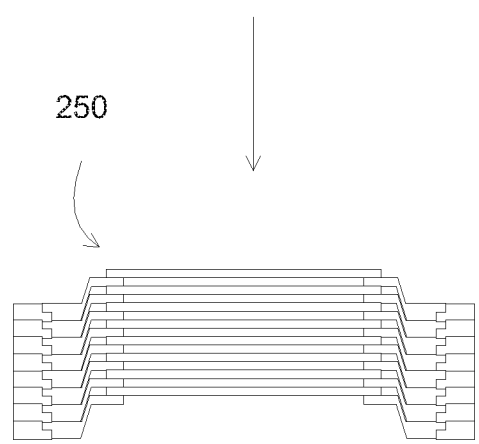

FIG. 2C shows the substrates 250, which are previously pictured in FIG. 2B, collapsed by the opener station.

FIG. 2D shows the substrates 260 in collapsed state in the storage chamber. This collapsed state may provide for higher density storage than otherwise. The movements and pitches of substrates in various locations and states may include high pitch in container 4 high pitch in opener, collapsing pitch in opener to provide high density stack, low pitch in opener 4 low pitch in storage chamber.

FIGS. 3A, 3B and 3C are process diagrams of an embodiment of the present invention substrate stocker, substrate carriers, or substrates with substrate stocker management software (SSCMS), wherein teaching to a basic stocker.

FIG. 3A shows Process 300 storing substrates in high density stacks in a stocker, wherein the high density stacks include a substrate pitch of less than 5 mm. FIG. 3B shows Process 320 Transferring individual substrates from a container to an opener station, wherein the substrates in the container includes a first pitch, Process 330 collapsing the substrates in the opener station to provide a high density stack, wherein the substrates in the high density stack include a second pitch smaller than the first pitch, Process 340 transferring all substrates in the high density stack together to a storage chamber. FIG. 3C shows Process 360 Transferring a high density stack from a storage chamber to an opener station, wherein the substrates in the high density stack include a first pitch, Process 370 enlarging the first pitch of the substrates in the opener station to a second pitch and Process 380 transferring one or more individual substrates with the second pitch from the opener station to a container.

FIGS. 4A, 4B, 4C and 4D are process diagrams of an embodiment of the present invention substrate stocker, substrate carriers, or substrates with substrate stocker management software (SSCMS) wherein teaching to an embodiment minimizing number of stacks needed to be opened for output requests.

FIG. 4A shows Process 400 Forming an operation software for a stocker, wherein the operation software minimizes a number of stacks needed to be opened for substrate output requests, wherein the operation software may be based on at least one of an input pattern and an output pattern. FIG. 4B shows Process 420 Selecting stack configurations for a substrate output request that have a minimum number of stacks, wherein the stack configurations meet a substrate requirement of the substrate output request, wherein the selection may be based on at least one of an input pattern and an output pattern. FIG. 4C shows Process 440 Selecting stacks for storing incoming substrates during a substrate input request, wherein the stacks are selected for minimizing a number of stacks needed to be opened during subsequent output requests, wherein the selection may be based on at least one of an input pattern and an output pattern. FIG. 4D shows Process 460 Rearranging substrates in stacks in a storage chamber of a stocker, wherein the stacks are rearranged for minimizing a number of stacks needed to be opened during subsequent output requests, wherein the rearranging may be based on at least one of an input pattern and an output pattern.

Figure 5:
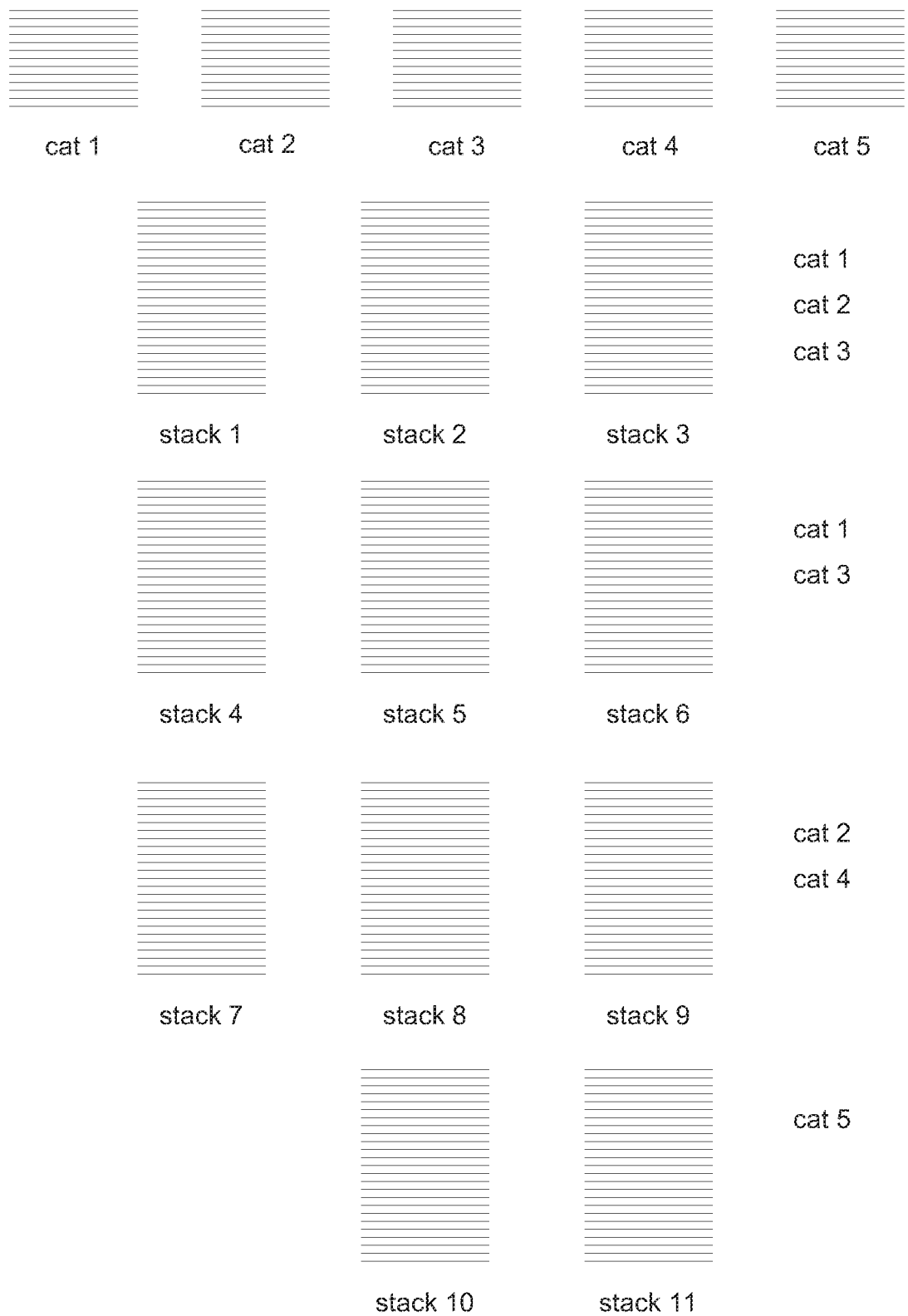
FIG. 5 may be a side component diagram of an embodiment of the present invention substrate stocker, substrate carriers, or substrates with substrate stocker management software (SSCMS).

FIG. 5 shows a side component diagram of an embodiment of the present invention substrate stocker, substrate carriers, or substrates with substrate stocker management software (SSCMS).

FIG. 5 teaches to an embodiment showing the categories, stacks and grouping which are able to be a part of at least one embodiment of the present invention. The category may provide or consists of wafers having a same characteristic, such as blank wafers, engineering wafers, product wafers. One example includes cat 1: blank test wafers, cat 2: blank prime wafers, cat 3: engineering wafers for experiment 1, cat 4: product wafers for product 1, cat 5: special wafers type 1, among many other types, category labels, naming, wafer types, application, divisions, reasons etc. The present invention stocks is able to store wafers having a common characteristic, such as cleanliness level each stack (e.g., Tec-cell stack) is able to store wafers of certain categories, e.g., categories sharing the common characteristic for example stack 1, stack 2, stack 3: cat 1, cat2, cat, stack 4, stack 5, stack 6: cat 1, cat 3, stack 7, stack 8, stack 9: cat 2, cat 4, stack 10, stack 11: cat 5, etc. The names, types, and all other characteristics are able to be stored on any data and processing network, system and through software are able to be displayed, acted upon or help in an automated system, as well as provide for an ability to call upon or manipulated storages and systems.

Figure 6A:
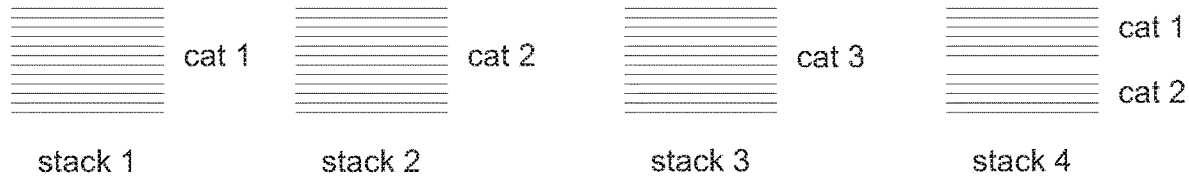
FIGS. 6A, 6B and 6C are side component diagrams of an embodiment of the present invention substrate stocker, substrate carriers, or substrates with substrate stocker management software (SSCMS).
Figure 6B:
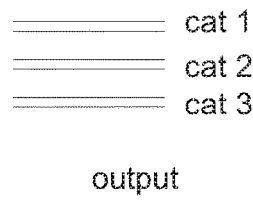
Figure 6C:
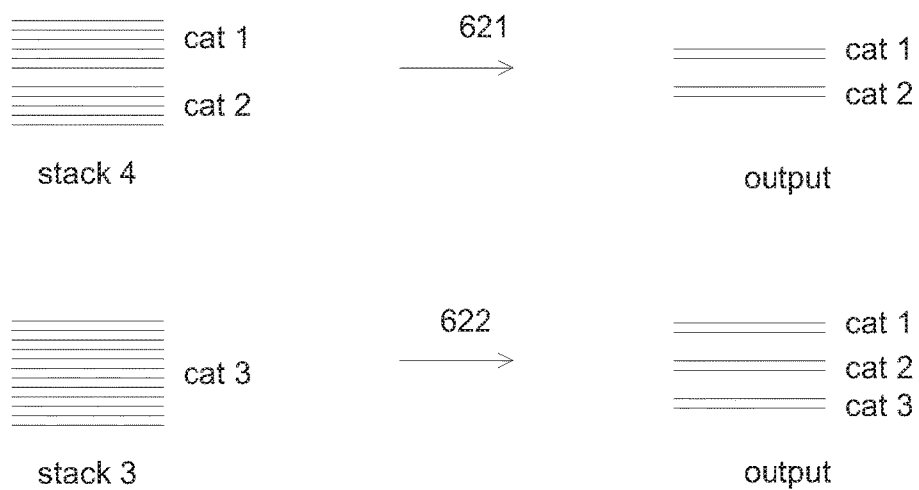

FIGS. 6A, 6B and 6C are side component diagrams of an embodiment of the present invention substrate stocker, substrate carriers, or substrates with substrate stocker management software (SSCMS).

FIG. 6A shows a storage configuration wherein a cat 1 and stack 1 are associated, along with respectively cat 2 and stack 2, stack 3 and cat 3, and stack 4 and cat 1 and also cat 2. The stack and categories may be associated with characteristics or outputs as mentioned previously. Then an output operation minimizing number of stacks used to get wafers based on an output request.

FIG. 6B shows an output request wherein determining stack configurations that match the output request and at least selecting a stack configuration with minimum number of stacks needed to be opened for wafer retrieval, or other permutations desired. Such as cat 1, car 2, and cat 3 being associated with an output.

FIG. 6C shows a sequence of taking stacks to opener and retrieve wafers and shows an example embodiment of selecting stacks to minimize the number of needed stacks wherein such as choosing stacks 3 and 4. Then only need to use 2 stacks to get cat 1, 2, and 3 wafers. For example taking stack 4 to opener to get cat 1 and cat 2 wafers in an first output transfer 621, then taking stack 3 to opener to get cat 3 wafers in a second output transfer 622 In other embodiment may be should be realized by one in the art that there are other options such as another option may be to choose stacks 1, 2, and 3, e.g., requiring opening 3 stacks instead of 2.

FIGS. 7A, 7B, 7C and 7D are side component diagrams of an embodiment of the present invention substrate stocker, substrate carriers, or substrates with substrate stocker management software (SSCMS) wherein an embodiment provides output operation that at least minimizes the number of stacks used to get wafers based on an output request and an output pattern.

Figure 7A:
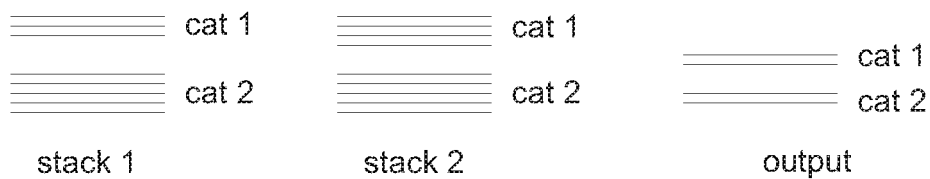
FIGS. 7A, 7B, 7C, 7D and 7E are side component diagrams of an embodiment of the present invention substrate stocker, substrate carriers, or substrates with substrate stocker management software (SSCMS).

FIG. 7A shows a storage configuration with stack 1 having cat 1 and cat 2, stack 2 having cat 1 and cat 2 and an output needed with cat 1 and cat 2.

Figure 7B:
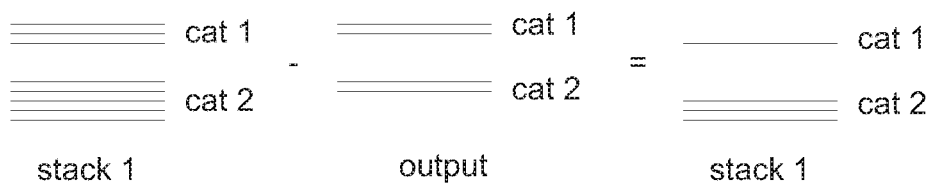

FIG. 7B provides an output request such that shows the remaining cat and stacks such that if an output of a number of cat 1 and cat 2 are needed, and stack 1 has a number of cat 1 and cat 2, then what is left is a resulting number of cat 1 and cat 2 in stack for a given output.

Figure 7C:
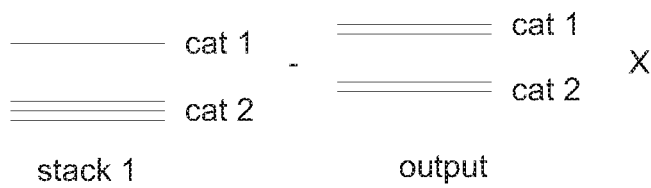

FIG. 7C provides a situation wherein the given output of cat 1 and cat 2 is not able to be provided by stack 1 cat 1 and cat 2 and so gives an error or provides the system to look to other stacks or needs. It is noted that the stacks and category pluralities may be any and combination and permutation may be of any. Also, there may conditions of any type, such as if there is enough of cat 1 and not of cat 2, to follow through with the move, or to replace the necessary cat 2 with cat 1 if there is not enough cat 2, for example.

Figure 7D:
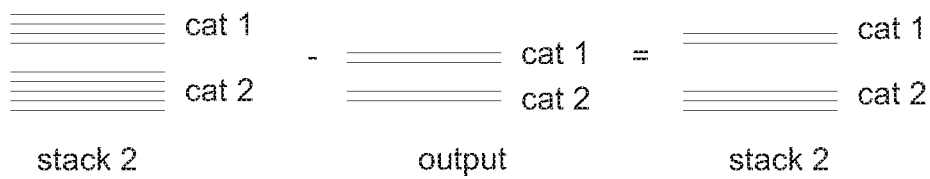
Figure 7E:
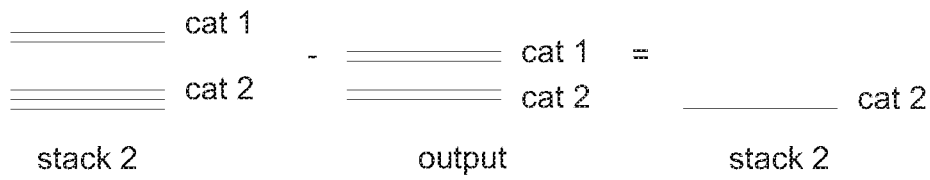

FIGS. 7D and 7E provide an output request such that shows the remaining cat and stacks such that if an output of a number of cat 1 and cat 2 are needed, and stack 2 has a number of cat 1 and cat 2, then what is left is a resulting number of cat 1 and cat 2 in stack for a given output. FIGS. 7D and 7E also provide a determination of a stock configuration that match in an optimal and pattern, and determinations of stack configurations that match the output request.

Ranking the stack configurations based on the output pattern, e.g., stack configurations with high ranking are configurations in which there may be a minimum number of stacks needed to be opened for today output (based on the output request) and future outputs (based on the output pattern). Then selecting a stack configuration with highest ranking. Selecting stacks based on a current output pattern or on a past output pattern or on a manually-provided pattern wherein the purpose may be to minimize the number of stacks that are needed to be opened for retrieval the output wafers. The past output pattern is able to include current output, the past output pattern is able to include outputs from any time frame. An operator is able to provide a manual pattern, for example, by knowing the specific need of the fab in the next few months, thus overriding the past output pattern with a manually-provided pattern, which is also able to be based on an input pattern (current or past) this may be an example of selecting stacks based on current output pattern. A new stocker has no past output, and thus the current output pattern may be also the past output pattern. It may be noted this may be an overly simplified example to illustrate the concept of selecting stacks based on an output pattern, such as Choosing stack 1: not good for potential future output, and Choosing stack 2: good for potential future output.

FIGS. 8A, 8B, 8C and 8D are side component diagrams of an embodiment of the present invention substrate stocker, substrate carriers, or substrates with substrate stocker management software (SSCMS).

Figures 8A, 8B:
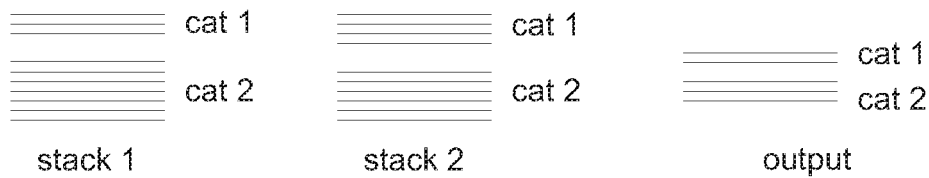
FIGS. 8A, 8B, 8C, 8D and 8E are side component diagrams of an embodiment of the present invention substrate stocker, substrate carriers, or substrates with substrate stocker management software (SSCMS).

FIG. 8A shows a storage configuration wherein there may be a stack 1 with cat 1 and cat 2.

FIG. 8B shows an output request with cat 1 and cat 2 in stack 2.

Figure 8C:
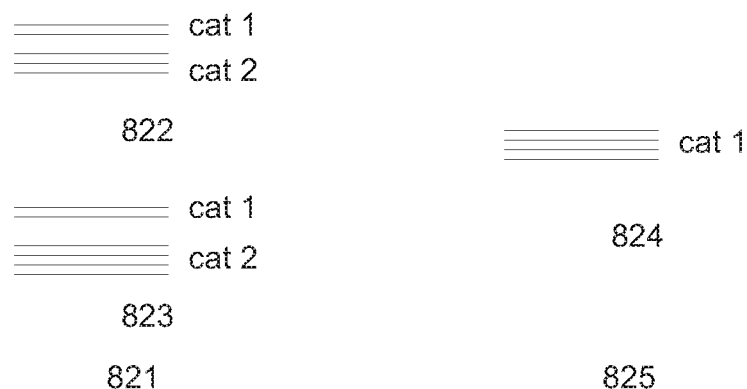

FIG. 8C shows output and input patterns with an output pattern 821 with output stream 1 822 with cat 1 and cat 2 and output stream 2 823 with cat 1 and cat 2 providing an input pattern 825 with input request of 825 with cat 1.

Figure 8D:
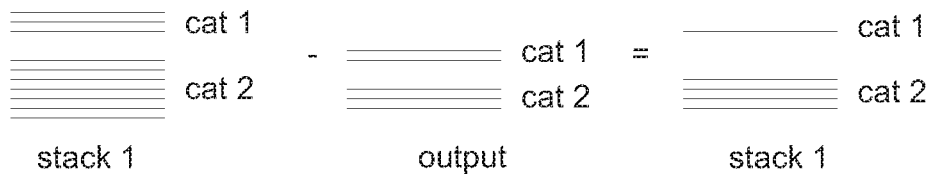
Figure 8E:
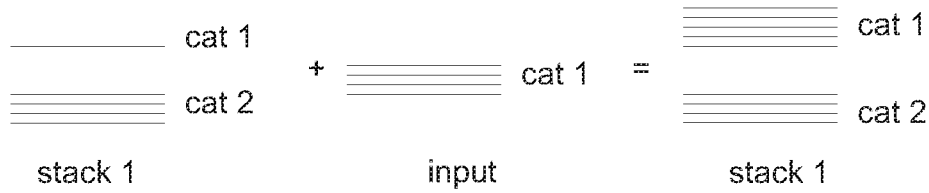

FIGS. 8D and 8E shows a best case or optimal procedure. This may be wherein then the embodiment minimizes number of stacks used to get wafers based on an output request, and output pattern, and an input pattern. Wherein determining stack configurations that match the output request. This may be provided by ranking the stack configurations based on the input pattern and/or the output pattern, e.g., stack configurations with high ranking are configurations in which there may be a minimum number of stacks needed to be opened for today output (based on the output request) and future outputs (based on the output pattern), taking into account the numbers of wafers bringing the stocker through the input pattern. This may include selecting a stack configuration with highest ranking.

For example as pictured in FIGS. 8D and 8E there may be an output with cat 1 and cat 2 such that taken out of stack 1 with cat 1 and cat 2 and then left with stack 1 with cat 1 and cat 2. FIG. 8E shows a stack 1 with cat 1 and cat 2 receiving an input of cat 1, such that then stack 1 includes a number of cat 1 and cat 2.

In an example embodiment as picture, by selecting stacks based on an input pattern and an output pattern, wherein the example may be overly simplified example to illustrate the concept of selecting stacks based on input and output patterns.

Choosing stack 1: the anticipated input will bring stack 1 to have enough wafers to accommodate output 1 or output 2 of the output pattern. Stack 2 may be already ready to accommodate either output of the output pattern. Thus, if the next output may be output 1 followed by output 2, stack 1 and stack 2 are able to handle the two outputs, for example, if the input pattern is known. Without the input pattern info, the selection of stack 1 or stack 2 may be equally good, meaning the stacks 1 and 2 are only ready for next 1 output, not 2 outputs. If stack 2 is chosen, stack 1 is able to be ready for either future output (output 1 or output 2), but stack 2 may be not ready for any output (not enough cat 2 wafers). This may be then done with or without the input wafers.

FIGS. 9A and 9B are process view of an embodiment of the present invention substrate stocker, substrate carriers, or substrates with substrate stocker management software (SSCMS) wherein output operation and optimizing selection of stacks to output wafers may be a goal along with minimizing the number of stacks, wherein it may be best to open only one stack, with all wafers needed for an output request may be contained in the stack, such that multiple stacks do not have to accessed, moved or contaminated, such that also efficiency in space may be kept.

FIG. 9A include at least Process 900 wherein electing stacks in a storage chamber of a stocker based on at least one of an input pattern and an output pattern to minimizing a number of needed stacks.

FIG. 9B includes at least Process 920 wherein at least Receiving a request for substrates, wherein the request includes category information of the substrates, Process 930 wherein at least obtaining stack configurations, wherein stacks in the stack configurations include substrates meeting the request, Process 940 wherein at least obtaining at least one of an input pattern and an output pattern, Process 950 wherein at least ranking the stack configurations based on the at least one of the input pattern and the output pattern, Process 960 wherein at least selecting stack configuration having highest ranking for obtaining substrates.

FIGS. 10A and 10B are process diagrams of an embodiment of the present invention substrate stocker, substrate carriers, or substrates with substrate stocker management software (SSCMS), wherein Forming input pattern or output pattern.

FIG. 10A shows an input pattern and FIG. 10B shows an output pattern, wherein periodicity: average time between input and output with the same wafer categories and wherein the deviation: standard deviation of the outputs.

In an embodiment as shown, of which may be an overly simplified example embodiment such that it can be a lot more complex, details of both input and output patterns are able to be used wherein in Prior Art output pattern may be typically more important than input pattern, because it directly relates to the selection of stacks to output wafers. Then, since both are used ingeniously in the present invention, the arrangement of wafers in stacks may be to satisfy the output patter, while the input pattern is able to assist in the arrangement of wafers in stacks.

FIGS. 11A, 11B, 11C and 11D are process diagrams of an embodiment of the present invention substrate stocker, substrate carriers, or substrates with substrate stocker management software (SSCMS), wherein forming input pattern based on input configurations, e.g., past inputs of the stocker forming output pattern based on output configurations, e.g., past outputs of the stocker.

FIG. 11A includes at least Process 1100 wherein at least Forming at least one of an input pattern and an output pattern based on information of inputting and outputting substrates to and from a stocker.

FIG. 11B includes at least Process 1120 wherein at least collecting information related to input configurations and/or output configurations of a stocker and process 1130 wherein at least Generating at least one of an input pattern and an output pattern based on the collected information, wherein the at least one of an input pattern and an output pattern may be configured to assist in optimizing operations of the stocker.

FIG. 11C includes at least Process 1150 wherein at least forming an input pattern or an output pattern for a stocker based on an anticipation of substrate input or substrate output to the stocker.

FIG. 11D includes at least Process 1170 wherein at least predicting at least one of a configuration of substrates inputting to a stocker and a configuration of substrates outputting from a stocker based on at least one of an input pattern and an output pattern.

Additionally, forming input pattern based on an anticipation of input, e.g., predicted future inputs of the stocker, such as forming output pattern based on an anticipation of output, e.g., predicted future outputs of the stocker and wherein the input/output pattern based on prediction is able to override the input/output pattern based on history which may return to historical in/out pattern after the special period (the period in which a different pattern is able to exist in the fab) predicting an input configuration, e.g., what wafers and what categories, may be going to be provided to the stocker. This can include predicting an output configuration, e.g., what wafers and what categories, may be going to be needed from the stocker.

FIGS. 12A, 12B, 12C, and 12D are process views of an embodiment of the present invention substrate stocker, substrate carriers, or substrates with substrate stocker management software (SSCMS).

FIG. 12A provides an input with stack 1 with cat 1 and cat 2, stack 2 with cat 1 and cat 2 and stack 3 with cat 1 and cat 2.

FIG. 12B shows an input of cat 1 and cat 2.

FIG. 12C shows an example output 1 with a number of cat 1 and cat 2 as well as output 2 with an output of cat 1 and cat such that the shown a ratio of output 1 and output 2 may be 1/1. The new input will be put to stack 1 to bring the available outputs to 1/1 ratio to provide output pattern 1221, and shows wherein stack 1→output 1, stack 2→output 2, stack 3→output 1 and output 2, among other configurations in other embodiments.

FIG. 12D shows a stack 1210 wherein stack 1 with cat 1 and cat 2 are provided for the aforementioned ratios.

FIGS. 13A, 13B, 13C and 13D are process views of an embodiment of the present invention substrate stocker, substrate carriers, or substrates with substrate stocker management software (SSCMS) wherein different ratios and combinations.

This may be then provided an input as seen in FIG. 13 A with stack 1 with given cat 1 and cat 2, stack 2 with cat 1 and cat 2 and stack 3 with cat 1 and cat 2.

FIG. 13B shows an input of cat 1 and cat 2.

FIG. 13C provides for an output 1 wherein with cat 1 and cat 2 and output 2 with cat 1 and cat 2 wherein the ratio for output 1 and output 2 is 2/1 which provides output pattern 1321. This example provides different ratios and combinations such as a larger then one ratio may be show where ratio of output 1 and output 2 may be 2/1.

Then as seen with FIG. 13D, there may be then stack 1310 and 1315 and stack 13 1320 such that the new input will be put to stacks 1 and 2 to bring the available outputs to 2/1 ratio, stack 1→output 2, stack 2→output 1, stack 3→output 1, among others in other embodiments.

FIGS. 14A, 14B and 14C are process diagrams of an embodiment of the present invention substrate stocker, substrate carriers, or substrates with substrate stocker management software (SSCMS) wherein may describe an input operation.

FIG. 14A may describe at least Process 1400 wherein distributing substrates from a substrate input process to stacks in a stocker based on an output pattern.

FIG. 14B may describe at least Process 1420 Selecting stacks in a stocker to receive substrates from a substrate input to the stocker, wherein the selection may be configured to improve a match of individual stacks with an output pattern.

FIG. 14C may describe at least Process 1440 wherein identifying substrate information in an input substrates to a stocker, Process 1450 wherein obtaining an output pattern of the stocker, wherein the output pattern includes output configurations, wherein the output configurations include substrates having characteristics, Process 1460 wherein determining stack configurations, wherein each stack in each stack configuration may be configured to receive one or more of the input substrates, wherein a stack in each stack configuration, after receiving one or more of the input substrates, has a better match with an output configuration in an output pattern and process 1470 wherein selecting a stack configuration having a best match of a ratio of the output configurations in the output pattern.

The above then may describe that an output pattern that is able to include various output configurations wherein an output configuration is able to include any number of wafers in category 1-number of wafers in category 2 among others. An output pattern is able to include frequencies of the output configurations. The frequencies are able to form ratios between the output configurations, such as output configuration 1 has a relative ratio of 8, output configuration 2 has a relative ratio of 5, output configuration 3 has a relative ratio of 1, etc. This can determine stack configurations to store wafers from an input, each stack configuration includes stacks that receive wafers. For example stack configuration 1 includes stack 1 to receive 2 wafers of cat 1, stack 3 to receive 3 wafers of cat 4, etc. The determination of which stack to receive which wafers may be so that the stack is able to contain one or more output configurations. For example an output configuration may be 2 cat 1 wafers and 4 cat 2 wafers. Stack 1 has 1 cat 1 wafer and 3 cat 2 wafers. Stack 1 is able to receive 1 cat 1 wafer and 1 cat 2 wafer-stack 2 has 2 cat 1 wafers and 7 cat 2 wafers. Stack 2 is able to receive 2 cat 1 wafers and 1 cat 2 wafer. Selecting a stack configuration that provide a best ratio match with the output configurations in the output pattern for example output pattern has 3 output configurations: output configuration 1 has a relative ratio of 8, output configuration 2 has a relative ratio of 5, output configuration 3 has a relative ratio of 1 current stocker has ratio of 6/2/1, stack configuration 1 is able to increase 1 output configuration 3, making a ratio of 6/2/2 stack configuration 2 is able to increase 1 output configuration 1, making a ratio of 7/2/1, stack configuration 3 is able to increase 1 output configuration 1 and 1 output configuration 2, making a ratio of 7/3/1, stack configuration 4 is able to increase 1 output configuration 1 and 2 output configuration 2, making a ratio of 7/4/1, thus stack configuration 4 is able to form a best match with the ratio FIGS. 15A, 15B, 15C, 15D and 15E are process views of an embodiment of the present invention substrate stocker, substrate carriers, or substrates with substrate stocker management software (SSCMS) wherein describes input operation wherein selecting stacks to receive wafers from an input command, the selection may be to minimize a number of stacks used to get wafers in subsequent output requests and the selection may be based on an output pattern and an input pattern.

Figure 15A:
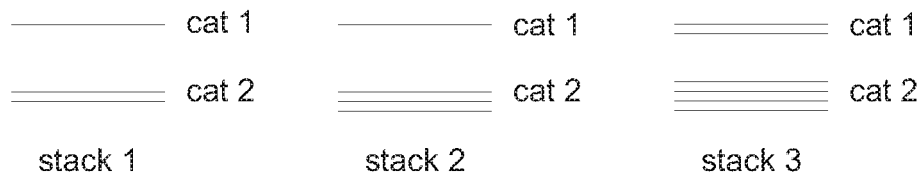
FIGS. 15A, 15B, and 15C are process views of an embodiment of the present invention substrate stocker, substrate carriers, or substrates with substrate stocker management software (SSCMS).

In FIG. 15A may be in stacks such as stack 1 with a given cat 1 and cat 2, stack 2 with cat 1 and cat 2 and stack 2 with cat 1 and cat 2.

Figure 15B:
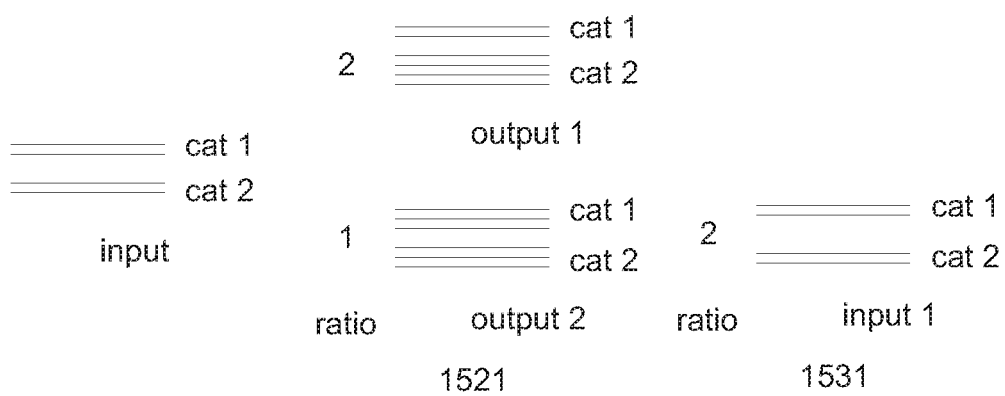

FIG. 15B shows an input may be a part of input 1 with cat 1 and cat 2 (of input pattern 1531) wherein with a 2:1 ratio the output pattern 1521 with output 1 and output 2 both with cat 1 and cat 2 with the aforementioned ratio of 2:1.

Figure 15C:
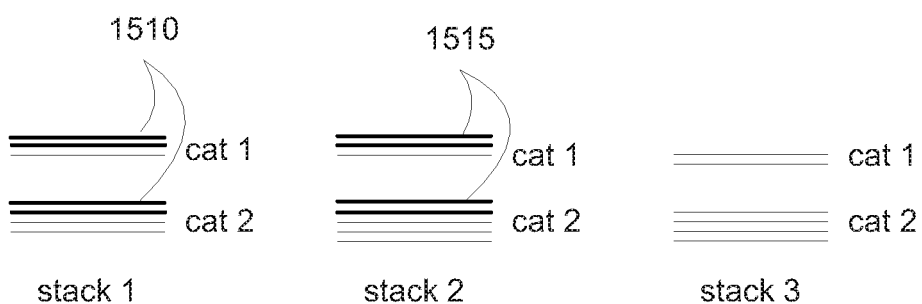

In FIG. 15C, it is noted then that input stack 1 1510 then with cat 1 and cat 2 and input stack 2 1515 may then wherein after input and input 1 (completing a cycle of input pattern), the stacks are ready to output the outputs (2 output 1 and 1 output 2) of output patterns.

FIGS. 16A, 16B, 16C, 16D and 16E are process views of an embodiment of the present invention substrate stocker, substrate carriers, or substrates with substrate stocker management software (SSCMS) wherein an input operation may be described.

Figure 16A:
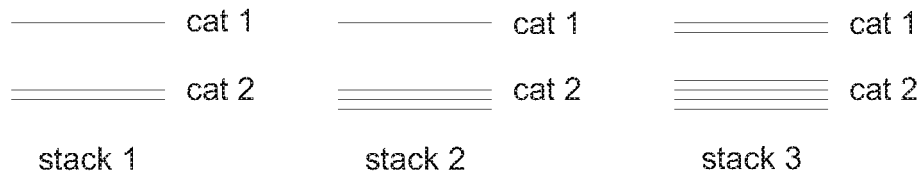
FIGS. 16A, 16B and 16C are process views of an embodiment of the present invention substrate stocker, substrate carriers, or substrates with substrate stocker management software (SSCMS).

FIG. 16A shows the input may be a part of input 1 may be of stack 1 with a given cat 1 and cat 2, a stack 2 with cat 1 and cat 2 and stack 3 with a cat 1 and cat 2.

Figure 16B:
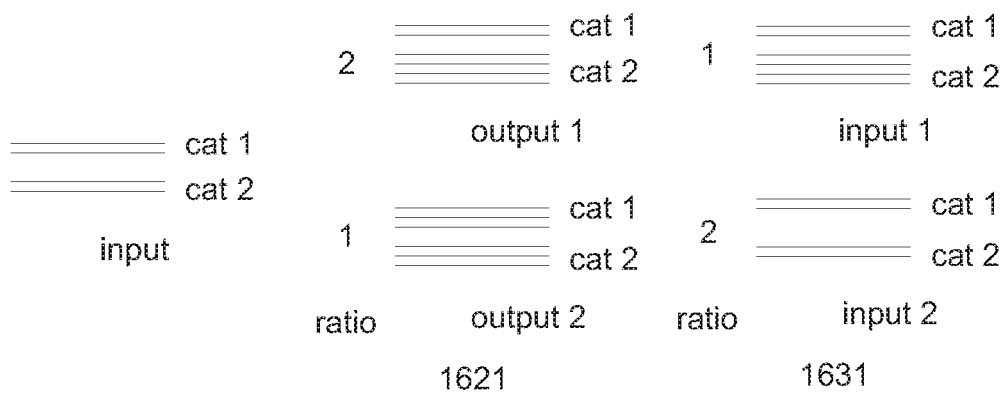

FIG. 16B shows the input with cat 1 and cat 2 with then a ratio of 2:1 output pattern 1621 input output 1 with cat 1 and cat 2 and output 2 with cat 1 and cat 2 such then an input pattern 1631 with ratio 1:2 such that input 2 input 1 is able to cancel 1 of output 1, so only need to handle 1 output 1 and 1 output 2.

Figure 16C:
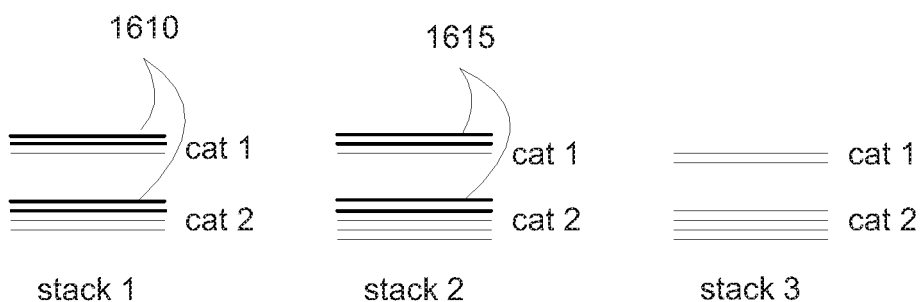

FIG. 16C shows that the input stack 1 may then have the 1610 and stack 2 with 1615 may then be seen to have the aforementioned ratios.

FIGS. 17A, 17B and 17C are process diagrams of an embodiment of the present invention substrate stocker, substrate carriers, or substrates with substrate stocker management software (SSCMS).

FIG. 17A shows Process 1700 wherein at least distributing substrates from a substrate input process to stacks in a stocker based on an output pattern and an input pattern.

FIG. 17B shows Process 1720 wherein at least Selecting stacks in a stocker to receive substrates from a substrate input to the stocker, wherein the selection may be configured to improve a match of individual stacks with an output pattern, taken into account an input pattern.

FIG. 17C shows Process 1740 wherein at least identifying substrate information in an input substrates to a stocker, Process 1750 wherein at least obtaining an output pattern and an input pattern of the stocker, Process 1760 wherein at least determining stack configurations, wherein the stack configurations improve a match of the stacks in the stocker with an output configuration in an output pattern, taken into account the input pattern, Process 1770 wherein at least selecting a stack configuration having a best match.

Figure 18A:
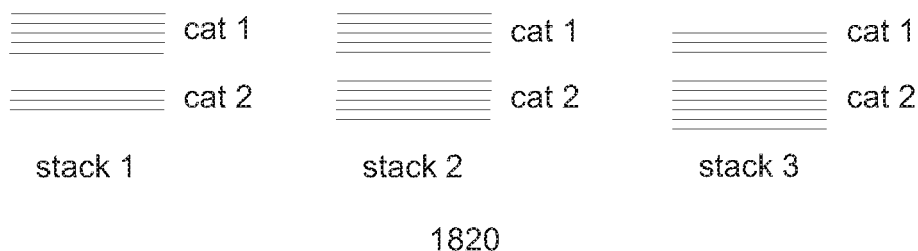
FIGS. 18A, 18B and 18C are process views of an embodiment of the present invention substrate stocker, substrate carriers, or substrates with substrate stocker management software (SSCMS).
Figure 18B:
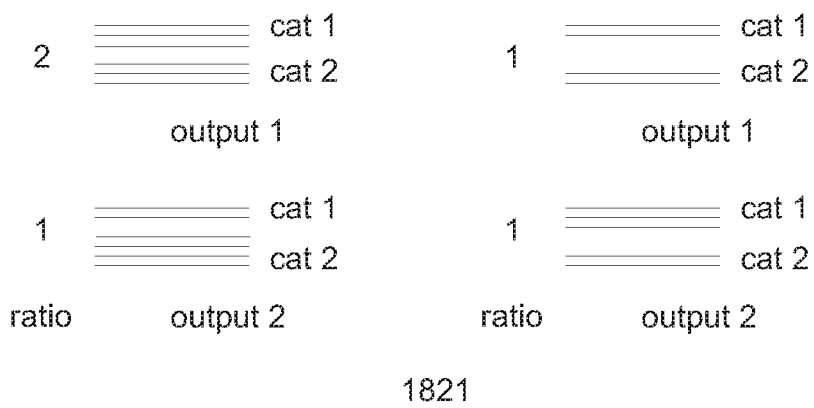
Figure 18C:
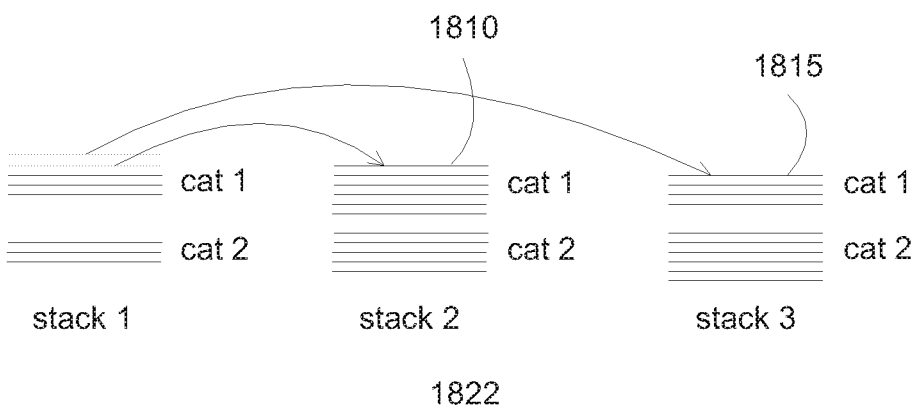

FIGS. 18A, 18B and 18C are process views of an embodiment of the present invention substrate stocker, substrate carriers, or substrates with substrate stocker management software (SSCMS) wherein includes a rearrangement operation. The operation may include rearranging wafers in stacks wherein the rearrangement may be to minimize a number of stacks used to get wafers in subsequent output requests, for example, provide a match of the wafers in the stacks with the wafers in the output pattern. In other embodiments the rearrangement may be based on an output pattern as well as other factors such as consolidating storage, moving like substrates together, moving aged or contaminated substrates together, etc.

FIG. 18A shows an output pattern 1820 wherein there may be a stack 1 with cat 1 and cat 2 stack 2 with cat 1 and cat 2 and a stack 3 with cat 1 and cat 2.

FIG. 18B shows an output pattern 1821 with a 2:1 ratio of output 1 with cat 1 and cat 2 and output 2 with cat 1 and cat 2 such that also a ratio of 1:1 with output 1 with cat 1 and cat 2 and output 2 with cat 1 and cat 2.

FIG. 17C shows an output pattern 1822 with a stack 2 1810 and Stack 3 1815 wherein then cat 1 of a stack 1 may then be moved in a given ratio as aforementioned, or by any ratio to stack 2 1810 or stack 3 1815.

FIGS. 19A, 19B and 19C are process diagrams of an embodiment of the present invention substrate stocker, substrate carriers, or substrates with substrate stocker management software (SSCMS).

FIG. 19A shows Process 1900 wherein at least rearranging substrates in a stocker based on an output pattern FIG. 19B shows Process 1920 wherein at least selecting stacks in a stocker to receive substrates from other stacks or to move substrates to other stacks, wherein the selection may be configured to improve a match of individual stacks with an output pattern.

FIG. 19C shows Process 1940 wherein at least obtaining an output pattern and an input pattern of the stocker, Process 1950 wherein at least determining stack pairs, wherein a stack pair includes an input stack and an output stack, wherein substrates are configured to move from the output stack to the input stack, wherein the stack pairs are configured to improve a match of the stacks in the stocker with an output pattern, Process 1960 wherein at least moving substrates in the stack pairs or any number of substrates.

FIGS. 20A, 20B, 20C and 20D are process views of an embodiment of the present invention substrate stocker, substrate carriers, or substrates with substrate stocker management software (SSCMS) wherein a rearrangement operation may be described such as rearranging wafers in stacks. This may include where the rearrangement may be to minimize a number of stacks used to get wafers in subsequent output requests, for example, provide a match of the wafers in the stacks with the wafers in the output pattern as well as the rearrangement may be based on an output pattern and an input pattern.

Figure 20A:
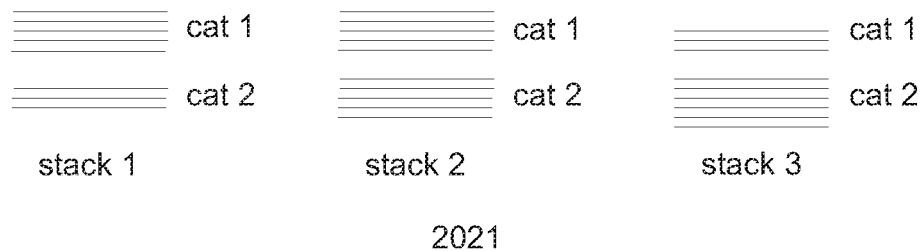
FIGS. 20A, 20B, 20C and 20D are process views of an embodiment of the present invention substrate stocker, substrate carriers, or substrates with substrate stocker management software (SSCMS).

FIG. 20A shows an output pattern 2021 with a stack 1 with cat 1 and 2, stack 2 with cat 1 and cat 2 and stack 3 with cat 1 and cat 2.

Figures 20B, 20C:
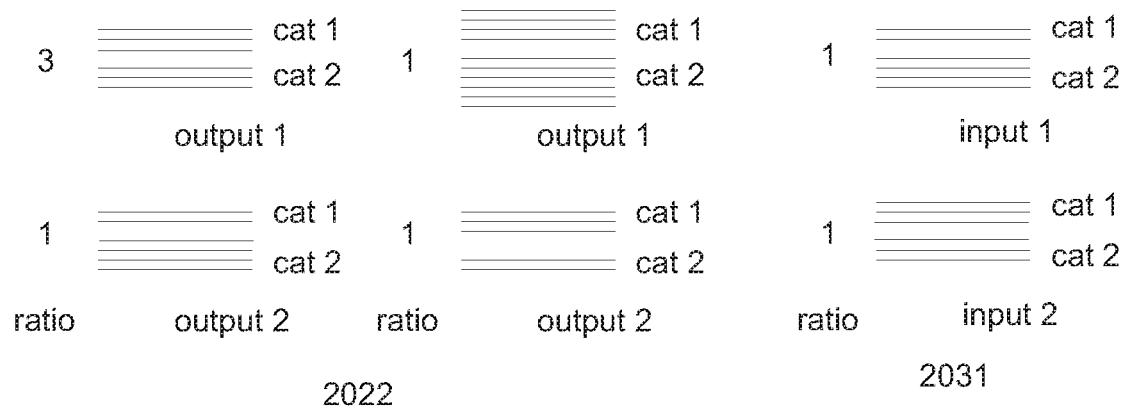

FIG. 20B shows an output pattern 2022 with a ratio of 3:1 for a given output 1 with cat 1 and cat 2 and output 2 with cat 1 and cat 2 and a ratio of 1:1 for an output 1 with cat 1 and cat 2 and an output 2 with cat 1 and cat 2.

FIG. 20C shows the input pattern 2031 with a ratio of 1:1 for an input 1 with cat 1 and cat 2 and input 2 with cat 1 and cat 2.

Figure 20D:
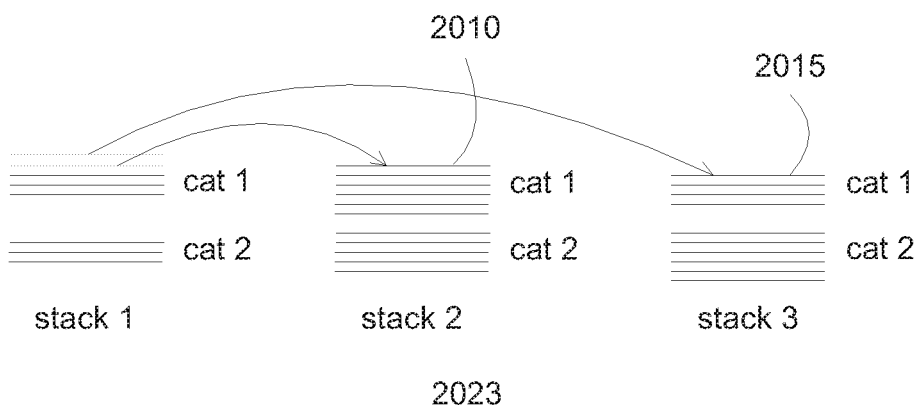

FIG. 20D shows an output pattern 2023 wherein then from stack 1 with cat 1 and cat 2, 2010 is moved to stack 2 with cat 1 and cat 2, and 2015 is moved to stack 3 with cat 1 and cat 2, such that the ratios aforementioned are realized.

FIGS. 21A, 21B, and 21C are process diagrams of an embodiment of the present invention substrate stocker, substrate carriers, or substrates with substrate stocker management software (SSCMS) wherein rearrangement based on output pattern and input pattern.

FIG. 21A shows Process 2100 wherein at least rearranging substrates in a stocker based on an output pattern and an input pattern.

FIG. 21B shows Process 2120 wherein at least selecting stacks in a stocker to receive substrates from other stacks or to move substrates to other stacks, wherein the selection may be configured to improve a match of individual stacks with an output pattern, taken into account an input pattern.

FIG. 21C shows Process 2140 wherein at least obtaining an output pattern and an input pattern of the stocker, Process 2150 wherein at least determining stack pairs, wherein a stack pair includes an input stack and an output stack, wherein substrates are configured to move from the output stack to the input stack, wherein the stack pairs are configured to improve a match of the stacks in the stocker with an output pattern, taken into account the input pattern, Process 2160 wherein at least moving substrates in the stack pairs, A number of embodiments have been described. Nevertheless, it may be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments may be within the scope of the following claims.

It may be appreciated that the various systems, methods, and apparatus disclosed herein may be embodied in a machine-readable medium and/or a machine accessible medium compatible with a data processing system (e.g., a computer system) and of which may be in any form including transitory, non-transitory or persistent data systems, as well as may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate processing, manufacturing, or storage system comprising:
   one or more storages including one or more separations that store a plurality of substrates, wherein the separations hold first containers that store carriers and the plurality of substrates in stacks;
   one or more loading stations that each include one or more robots, wherein each robot is able to access and move at least one of: the first containers, a second container or carrier, and one of the plurality of substrates;
   one or more opener systems that open the first containers such that the carriers and the plurality of substrates are able to be accessed by the one or more robots in the loading station; and
   a software management system that assigns at least one category to each stack of carriers and the plurality of substrates; wherein
   the first containers store the plurality of substrates with a higher density than the second container or carrier; and
   the one or more opener systems each include effectors that each hold an individual one of the plurality of substrates.

2. A substrate processing, manufacturing, or storage system as in claim 1, wherein each stack includes only a single category.

3. A substrate processing, manufacturing, or storage system as in claim 1, further comprising:
a user interface; wherein
the software management system is able to be controlled via a network Connection.

4. A substrate processing, manufacturing, or storage system as in claim 1, wherein each stack includes different categories assigned for different carriers and substrates within the stack.

5. A substrate processing, manufacturing, or storage system as in claim 4, wherein the categories are based on pre-defined physical characteristics of the carriers and pre-defined physical characteristics of the plurality of substrates or pre-defined physical characteristics of each stack.

6. A substrate processing, manufacturing, or storage system in claim 4, wherein the categories are based on current condition sensor data.

7. A substrate processing, manufacturing, or storage system as in claim 4, wherein:
the categories are dependent on a time characteristic of each stack or the carriers and the plurality of substrates, and
the categories are changed on a time-dependent basis.

8. A substrate processing, manufacturing, or storage system in claim 1, wherein the software management system controls at least one station such that the software controls actions including at least one of: combining stacks, rearranging stacks, combining categories, or other outputs based on the categories assigned.

9. A substrate processing, manufacturing, or storage system as in claim 8, further comprising:
a ranking system based on defined categories.

10. A substrate processing, manufacturing, or storage system as in claim 8, wherein the software management system optimizes or minimizes a route, a number of accesses, a number of stacks, a number of storage operations, or a number of other operations.

11. A substrate processing, manufacturing, or storage system as in claim 10, wherein the optimization or minimization is based on an input request and pattern.

12. A substrate processing, manufacturing, or storage system as in claim 10, wherein the optimization or minimization is based on an output pattern or limitation.

13. A software management method to manage a substrate storage, comprising:
providing a stack of carriers and substrates in a first container,
storing the stack of carriers and substrates in the first container in a storage separation, wherein the storage separation is inventoried by at least quantity and category,
assigning at least one category to each stack of carriers and substrates, and
selectively moving the first container or a second container to an opener station, wherein
the first container stores the carriers and substrates with a higher density than the second container; and
the opener station includes effectors that each hold an individual one of the plurality of substrates.

14. A software management method as in claim 13, wherein each stack includes carriers and substrates assigned a same category.

15. A software management method as in claim 13, wherein each stack has different categories assigned for different carriers and substrates, within the stack.

16. A software management method as in claim 13, wherein the categories are based on a characteristic of the carriers, and the substrates.

17. A software management method as in claim 13, further comprising:
providing a desired stack configuration output for at least one stack and associated container for output, wherein:
the stack configuration includes criteria for quantity and category for an output stack,
checking the inventory of the storage separation for the requested output,
calculating a required input from the storage separation to match the requested output, wherein the input at least satisfied the desired stack configuration output.

18. A software management method as in claim 17, wherein the step of calculating calculates the fastest and most efficient movement for the required input to match the requested output.

19. A software management method as in claim 17, further comprising:
moving at least the containers from the required input and requested output by a loading station to the opener station,
opening the first container such that the carriers and the substrates are accessible,
accessing the carriers and the substrates and moving them to a transfer station such that the transfer station contents matches the requested output.

20. A software management method as in claim 19, further comprising:
transporting the transfer station to a destination location.

* * * * *